(12) United States Patent
Bergsma

(10) Patent No.: US 10,396,735 B2
(45) Date of Patent: Aug. 27, 2019

(54) AMPLIFIER SYSTEM WITH DIGITAL SWITCHED ATTENUATOR

(71) Applicant: SKYWORKS SOLUTIONS, INC., Woburn, MA (US)

(72) Inventor: Adrian John Bergsma, Ottawa (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/808,389

(22) Filed: Nov. 9, 2017

(65) Prior Publication Data

US 2018/0138874 A1 May 17, 2018

Related U.S. Application Data

(60) Provisional application No. 62/420,681, filed on Nov. 11, 2016.

(51) Int. Cl.
| | |
|---|---|
| H03G 3/20 | (2006.01) |
| H03G 1/00 | (2006.01) |
| H03F 3/19 | (2006.01) |
| H03F 3/21 | (2006.01) |
| H04L 27/00 | (2006.01) |
| H04B 10/00 | (2013.01) |
| H03G 3/30 | (2006.01) |
| H03F 3/24 | (2006.01) |
| H03F 3/45 | (2006.01) |
| H04L 25/08 | (2006.01) |

(52) U.S. Cl.
CPC ............ *H03G 1/0088* (2013.01); *H03F 3/19* (2013.01); *H03F 3/21* (2013.01); *H03F 3/245* (2013.01); *H03F 3/45475* (2013.01); *H03G 3/3042* (2013.01); *H04B 10/00* (2013.01); *H04L 27/0002* (2013.01); *H03F 2200/411* (2013.01); *H03F 2200/451* (2013.01); *H03G 2201/106* (2013.01); *H04L 25/085* (2013.01)

(58) Field of Classification Search
CPC ........... H03G 3/20; H03G 3/30; H03G 1/0088
USPC .................................................. 330/144, 284
See application file for complete search history.

(56) References Cited

U.S. PATENT DOCUMENTS

| | | | |
|---|---|---|---|
| 3,882,484 | A | 5/1975 | Brokaw et al. |
| 5,157,323 | A | 10/1992 | Ali et al. |
| 5,912,599 | A | 6/1999 | Beall |
| 6,094,055 | A | 7/2000 | Dosdall et al. |

(Continued)

FOREIGN PATENT DOCUMENTS

EP 2722984 A2 4/2014

OTHER PUBLICATIONS 3.3 V, Upstream Cable Line Driver, AD8324, Analog Devices, Inc., 2016, <http://www.analog.com/media/en/technical-documentation/data-sheets/AD8324.pdf> [retrieved from the Internet on Dec. 15, 2017].

(Continued)

*Primary Examiner* — Steven J Mottola
(74) *Attorney, Agent, or Firm* — Lando & Anastasi, LLP

(57) ABSTRACT

A broadband amplifier assembly is provided that includes a fixed gain amplifier coupled to an adjustable attenuator which is further coupled to a power amplifier. The adjustable attenuator includes a plurality of attenuation cells directly coupled in series between the input and the output of the adjustable attenuator.

20 Claims, 9 Drawing Sheets

(56) References Cited

U.S. PATENT DOCUMENTS

| | | | |
|---|---|---|---|
| 6,462,327 B1* | 10/2002 | Ezell | H03F 3/087 |
| | | | 250/214 A |
| 6,472,948 B1 | 10/2002 | Kyriakos et al. | |
| 6,489,856 B1 | 12/2002 | Weigand | |
| 6,876,271 B2 | 4/2005 | Evers et al. | |
| 7,196,566 B2 | 3/2007 | Kaiser, Jr. | |
| 7,868,681 B2 | 1/2011 | van der Wagt | |
| 8,970,296 B1 | 3/2015 | Pratt | |
| 8,975,947 B1 | 3/2015 | Seshita | |
| 9,531,359 B1 | 12/2016 | Shrivastava | |
| 2001/0033206 A1 | 10/2001 | Constantine et al. | |
| 2002/0119797 A1 | 8/2002 | Woodhead et al. | |
| 2006/0244548 A1 | 11/2006 | Noest et al. | |
| 2008/0100404 A1 | 5/2008 | Vice | |
| 2008/0122693 A1* | 5/2008 | Needham | G01S 7/03 |
| | | | 342/368 |
| 2008/0218269 A1* | 9/2008 | Kirisawa | H03G 3/3042 |
| | | | 330/284 |
| 2010/0141363 A1 | 6/2010 | Yan et al. | |
| 2010/0164656 A1 | 7/2010 | Chiu | |
| 2010/0194489 A1 | 8/2010 | Kearns et al. | |
| 2011/0032021 A1 | 2/2011 | Dianbo | |
| 2013/0043962 A1 | 2/2013 | Granger-Jones | |
| 2014/0002214 A1 | 1/2014 | Bawell et al. | |
| 2014/0002282 A1 | 1/2014 | Bawell et al. | |
| 2015/0171828 A1 | 6/2015 | Lam | |
| 2015/0244051 A1 | 8/2015 | Domino | |
| 2015/0326204 A1 | 11/2015 | Cho et al. | |
| 2015/0326205 A1 | 11/2015 | Cho et al. | |
| 2015/0381139 A1 | 12/2015 | Kiser | |
| 2016/0118959 A1 | 4/2016 | Atesal et al. | |
| 2016/0134259 A1 | 5/2016 | Shrivastava et al. | |
| 2017/0141802 A1 | 5/2017 | Solomko et al. | |
| 2017/0250723 A1 | 8/2017 | Srirattana | |

OTHER PUBLICATIONS

"ARA05050 Reverse Amplifier with Step Attenuator Data Sheet", Skyworks Solutions, Inc., 2016, <http://www.skyworksinc.com/uploads/documents/ARA05050_204227B.pdf> [retrieved from the Internet on Dec. 15, 2017].

"ARA2000 Address-Programmable Reverse Amplifier with Step Attenuator Data Sheet", Skyworks Solutions, Inc., 2016, <http://www.skyworksinc.com/uploads/documents/ARA2000_204228B.pdf> [retrieved from the Internet on Dec. 15, 2017].

"BGA3131 DOCSIS 3.1 upstream amplifier Product data sheet", NSP Semiconductors N.V., 2016, <https://www.nxp.com/docs/en/data-sheet/BGA3131.pdf> [retrieved from the Internet on Dec. 12, 2017].

"DOCSIS 3.0 Upstream Amplifier", Maxim, 2009, <https://media.digikey.com/pdf/Data%20Sheets/Maxim%20PDFs/MAX3518.pdf> [retrieved from the Internet on Dec. 15, 2017].

* cited by examiner

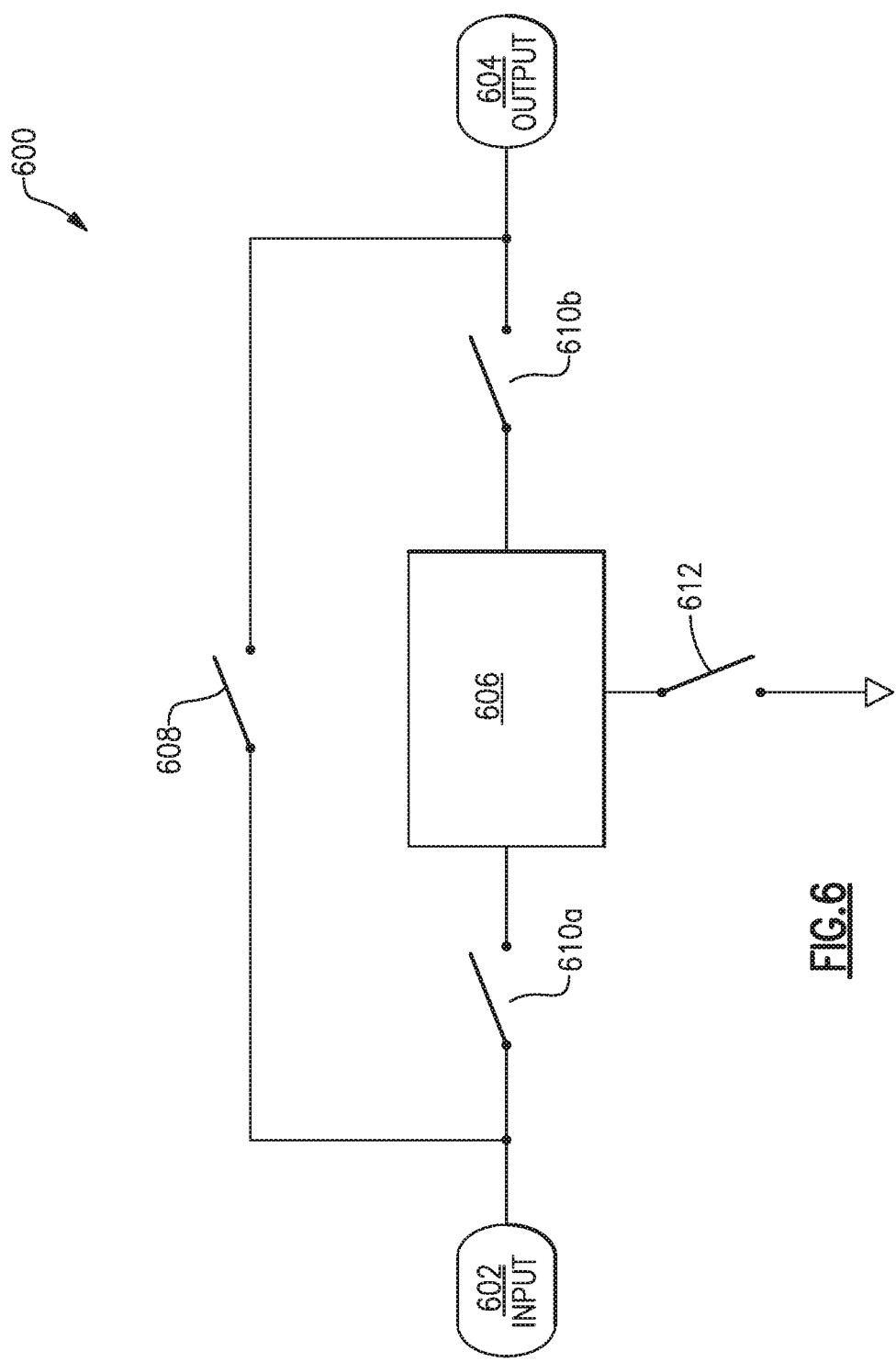

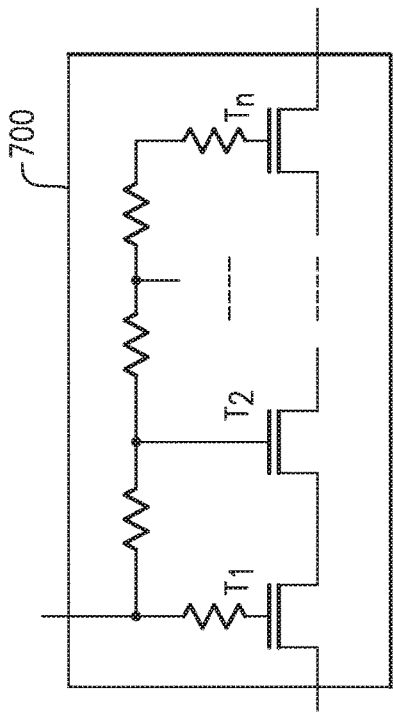
FIG. 7A
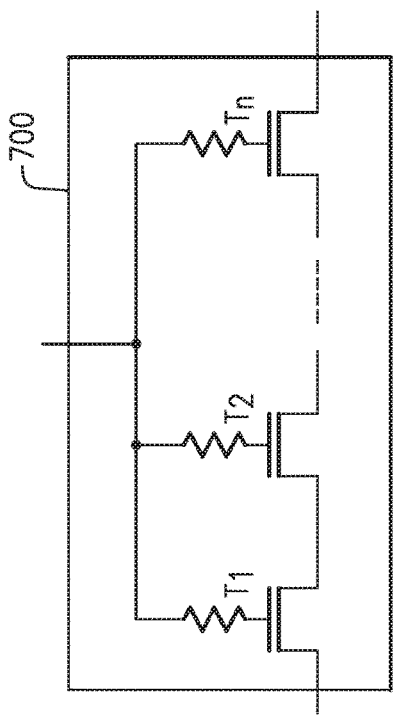
FIG. 7B
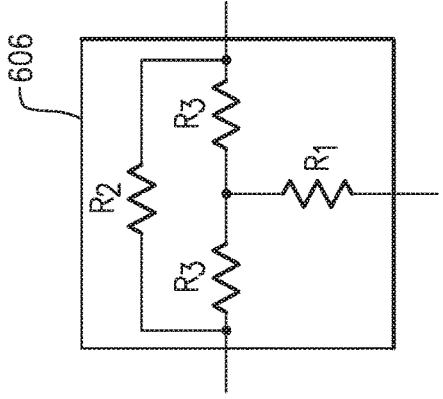
FIG. 8A
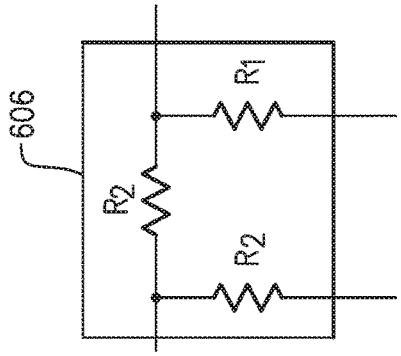
FIG. 8B
FIG. 8C

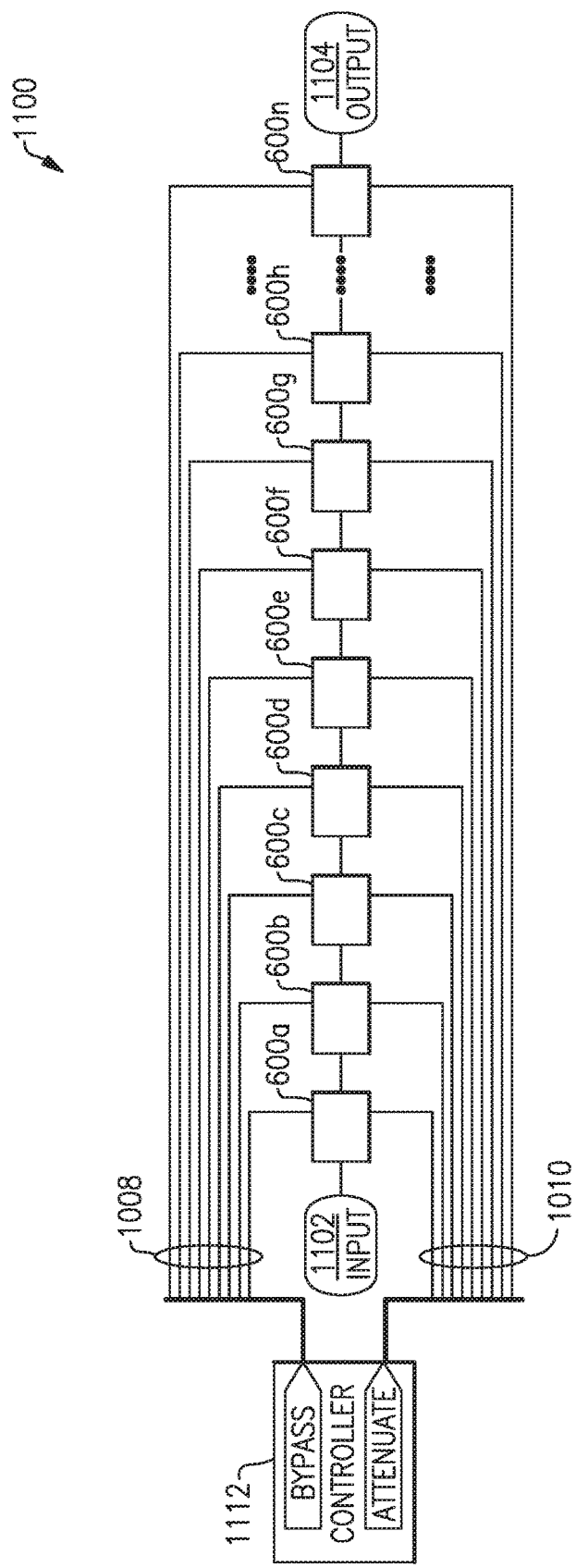

AMPLIFIER SYSTEM WITH DIGITAL SWITCHED ATTENUATOR

CROSS-REFERENCE TO RELATED APPLICATIONS

This application claims the benefit under 35 U.S.C. § 119(e) of U.S. Provisional patent application Ser. No. 62/420,681 titled AMPLIFIER SYSTEM WITH DIGITAL SWITCHED ATTENUATOR filed on Nov. 11, 2016.

This application further relates to U.S. patent application Ser. No. 15/808,486 filed on Nov. 9, 2017, and titled HIGH-LINEARITY VARIABLE GAIN AMPLIFIER WITH BYPASS PATH, which claims the benefit under 35 U.S.C. § 119(e) of U.S. Provisional Patent Application No. 62/420,326 titled HIGH-LINEARITY VARIABLE GAIN AMPLIFIER WITH BYPASS PATH filed on Nov. 10, 2016, each of which is herein incorporated by reference in its entirety for all purposes.

This application further relates to U.S. patent application Ser. No. 15/808,341 filed on Nov. 9, 2017, and titled WIDE DYNAMIC RANGE AMPLIFIER SYSTEM, which claims the benefit under 35 U.S.C. § 119(e) of U.S. Provisional Patent Application No. 62/420,875 titled WIDE DYNAMIC RANGE AMPLIFIER SYSTEM filed on Nov. 11, 2016, each of which is herein incorporated by reference in its entirety for all purposes.

This application further relates to U.S. patent application Ser. No. 15/808,372 filed on Nov. 9, 2017, and titled TRANSIENT OUTPUT SUPPRESSION IN AN AMPLIFIER, which claims the benefit under 35 U.S.C. § 119(e) of U.S. Provisional Patent Application No. 62/420,907 titled TRANSIENT OUTPUT SUPPRESSION IN AN AMPLIFIER filed on Nov. 11, 2016, each of which is herein incorporated by reference in its entirety for all purposes.

This application further relates to U.S. patent application Ser. No. 15/808,358 filed on Nov. 9, 2017, and titled REDUCING IMPEDANCE DISCONTINUITIES ON A SHARED MEDIUM, which claims the benefit under 35 U.S.C. § 119(e) of U.S. Provisional Patent Application No. 62/421,084 titled REDUCING IMPEDANCE DISCONTINUITIES ON A SHARED MEDIUM filed on Nov. 11, 2016, each of which is herein incorporated by reference in its entirety for all purposes.

This application further relates to U.S. patent application Ser. No. 15/808,458 filed on Nov. 9, 2017, and titled TEMPERATURE COMPENSATED OSCILLATOR, which claims the benefit under 35 U.S.C. § 119(e) of U.S. Provisional Patent Application No. 62/420,806 titled TEMPERATURE COMPENSATED OSCILLATOR filed on Nov. 11, 2016, each of which is herein incorporated by reference in its entirety for all purposes.

BACKGROUND

Data Over Cable Service Interface Specifications (DOCSIS) are developed by CableLabs, a non-profit consortium of cable operators focused on technologies and specifications for delivery of data signals that carry information such as data, video, voice, or other information, and for delivery of additional next generation services. DOCSIS defines the signal parameters for communications transmissions over a cable service infrastructure.

Evolution in the cable industry, particularly in the cable television service, has resulted in the reduction or elimination of traditional analog television channels that previously utilized frequencies as low as 54 MHz in the United States. This has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the frequency range supported by DOCSIS 3.0, covering more than five and a third octaves. Additionally, full compliance with DOCSIS 3.1 requires support for power output up to 65 dBmV into 75 Ohm loads across the entire spectrum. Conventional amplifiers for these systems have not met the demanding challenges of power output dynamic range across the wide spectrum range necessary for full compliance with DOCSIS 3.1 and anticipated future standards.

SUMMARY

Aspects and examples are directed to amplifier systems and components thereof, and to devices, modules, and systems incorporating the same. Amplifier systems and methods disclosed herein are capable of a high range of dynamic power output across a broad frequency spectrum. In some examples, a combination of amplification and attenuation components are applied to meet various challenges of maintaining linearity and noise output limits, among other criteria.

Aspects and examples are directed to amplifier systems that include an adjustable attenuator having directly coupled switched attenuation cells to provide a broad bandwidth, simplified control, and low susceptibility to process variation. The broad bandwidth may be achieved by, for example, direct coupling of one attenuation cell to the next with no intentional capacitive element to couple one cell to the next, thereby making the adjustable attenuator less frequency dependent and extending the usable bandwidth. This provides an amplifier system suitable for a broad range of applications, supporting lower low frequencies and higher high frequencies for a given design than conventional designs. Simplified control may be achieved, for example, by allowing an arbitrary mapping of desired attenuation levels to individual attenuation cells and control signals. Further, the adjustable attenuators disclosed herein are less susceptible to process variation due, at least in part, to a design approach to achieve various attenuation levels, within each attenuation cell, using selected circuit architectures and few elemental impedances in various combinations to form overall desired impedance values. This approach results in the overall impedance being consistent despite variation in the elemental impedances brought about by fabrication techniques and process variation.

According to one aspect a broadband amplifier assembly having a signal input and a signal output is provided and includes a fixed gain amplifier having an input and an output, the input coupled to the signal input, an adjustable attenuator having an input and an output, the input of the adjustable attenuator being coupled to the output of the fixed gain amplifier, the adjustable attenuator having a plurality of attenuation cells directly coupled in series between the input and the output of the adjustable attenuator, and a power amplifier having an input and an output, the input of the power amplifier being coupled to the output of the adjustable attenuator and the output of the power amplifier being coupled to the signal output.

In some embodiments, each respective attenuation cell of the plurality of attenuation cells includes a resistive network coupled between an input of the respective attenuation cell and an output of the respective attenuation cell, the resistive network configured to provide a respective amount of attenuation in an attenuation mode of operation of the respective attenuation cell. Each respective attenuation cell may include a shunt switch coupled between the resistive network and a reference node to selectively connect the resistive network to the reference node. Each respective attenuation cell may include a bypass switch in parallel with the resistive network, the bypass switch configured to selectively couple the input of the respective attenuation cell to the output of the respective attenuation cell in a bypass mode of operation of the respective attenuation cell. Each respective attenuation cell may include an isolation switch coupled in series with the resistive network, the isolation switch and the resistive network being in parallel with the bypass switch, the isolation switch configured to selectively isolate the resistive network from one of the input of the respective attenuation cell or the output of the respective attenuation cell in the bypass mode of operation of the respective attenuation cell. In some embodiments, the bypass switch and the isolation switch each include a switching element of substantially similar parasitic characteristics. In some embodiments, the isolation switch is configured to selectively isolate the resistive network from one of the input of the respective attenuation cell or the output of the respective attenuation cell in an isolation mode of operation of the respective attenuation cell.

According to certain embodiments, each respective attenuation cell includes a resistive network and a shunt switch coupled between the resistive network and a reference node to selectively connect the resistive network to the reference node. In some embodiments the shunt switch includes a plurality of switching elements.

According to certain embodiments, each respective attenuation cell includes a resistive network and a bypass switch in parallel with the resistive network, the bypass switch configured to selectively couple the input of the respective attenuation cell to the output of the respective attenuation cell in a bypass mode of operation of the respective attenuation cell. According to another aspect, a broadband amplifier assembly having a signal input and a signal output is provided and includes a fixed gain amplifier having an input and an output, the input coupled to the signal input, an adjustable attenuator having an input and an output, the input of the adjustable attenuator being coupled to the output of the fixed gain amplifier, the adjustable attenuator having a plurality of attenuation cells directly coupled in series between the input and the output of the adjustable attenuator, a variable gain amplifier having an input and an output, the input of the variable gain amplifier being coupled to the output of the adjustable attenuator and the output of the variable gain amplifier being coupled to the signal output, and a controller configured to control an amount of attenuation provided by the adjustable attenuator and an amount of gain provided by the variable gain amplifier to provide a range of overall gain combinations.

In some embodiments, each respective attenuation cell of the plurality of attenuation cells includes a resistive network coupled between an input of the respective attenuation cell and an output of the respective attenuation cell, the resistive network configured to provide a respective amount of attenuation in an attenuation mode of operation of the respective attenuation cell. Each respective attenuation cell may include a shunt switch coupled between the resistive network and a reference node to selectively connect the resistive network to the reference node. Each respective attenuation cell may include a bypass switch in parallel with the resistive network, the bypass switch configured to selectively couple the input of the respective attenuation cell to the output of the respective attenuation cell in a bypass mode of operation of the respective attenuation cell. Each respective attenuation cell may include an isolation switch coupled in series with the resistive network, the isolation switch and the resistive network being in parallel with the bypass switch, the isolation switch configured to selectively isolate the resistive network from one of the input of the respective attenuation cell or the output of the respective attenuation cell in the bypass mode of operation of the respective attenuation cell. In some embodiments, the bypass switch and the isolation switch each include a switching element of substantially similar parasitic characteristics. In some embodiments, the isolation switch is configured to selectively isolate the resistive network from one of the input of the respective attenuation cell or the output of the respective attenuation cell in an isolation mode of operation of the respective attenuation cell.

According to certain embodiments, each respective attenuation cell includes a resistive network and a shunt switch coupled between the resistive network and a reference node to selectively connect the resistive network to the reference node. In some embodiments the shunt switch includes a plurality of switching elements.

According to certain embodiments, each respective attenuation cell includes a resistive network and a bypass switch in parallel with the resistive network, the bypass switch configured to selectively couple the input of the respective attenuation cell to the output of the respective attenuation cell in a bypass mode of operation of the respective attenuation cell.

According to another aspect, a communication device is provided and includes a transceiver configured to produce a transmit signal and to receive a receive signal, a fixed gain amplifier having an input and an output, the input coupled to the transceiver to receive the transmit signal, an adjustable attenuator having an input and an output, the input of the adjustable attenuator being coupled to the output of the fixed gain amplifier, the adjustable attenuator having a plurality of attenuation cells directly coupled in series between the input and the output of the adjustable attenuator, and a power amplifier having an input and an output, the input of the power amplifier being coupled to the output of the adjustable attenuator and the output of the power amplifier being coupled to an output terminal.

In some embodiments, the power amplifier is a variable gain amplifier.

Certain embodiments include a receive amplifier coupled to the transceiver to provide the receive signal.

Still other aspects, examples, and advantages are discussed in detail below.

Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

In the event of inconsistent usages of terms between this document and documents incorporated herein by reference, the term usage in the incorporated references is supplementary to that of this document; for irreconcilable inconsistencies, the term usage in this document controls.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, identical or nearly identical components illustrated in various figures may be represented by like numerals. For purposes of clarity, not every component may be labeled in every figure. In the figures:

FIG. 6 is a schematic circuit diagram of an example of an attenuation cell;

FIGS. 7A-7B are schematic circuit diagrams of examples of digital switches;

FIGS. 8A-8C are schematic circuit diagrams of examples of resistive networks;

FIG. 11 is a block diagram of a multi-cell digital switched attenuator.

DETAILED DESCRIPTION

Figure 1:
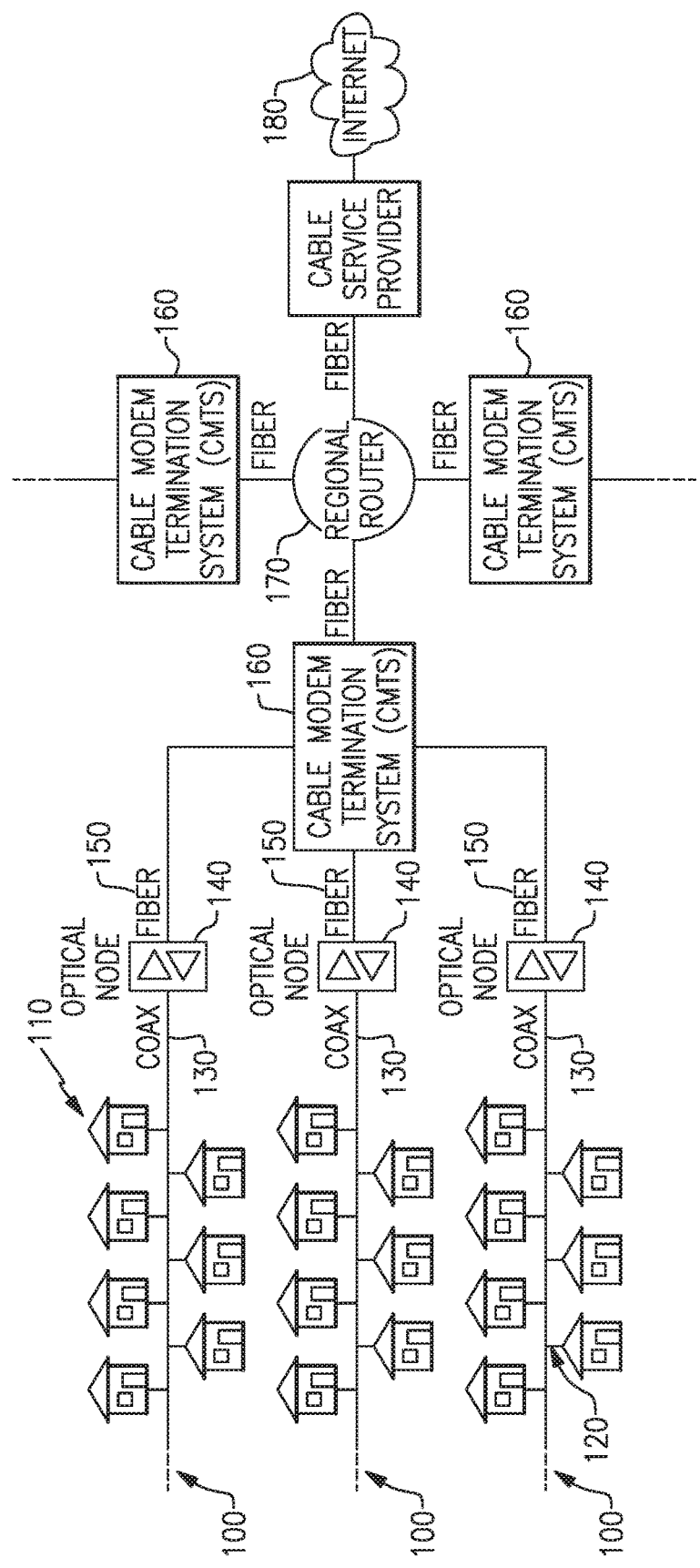
FIG. 1 is a schematic diagram of a data over cable services environment.

Aspects and examples are directed to amplifier systems including an adjustable attenuator, and components thereof, and to devices, modules, and systems incorporating same. Amplifier system and methods disclosed herein include an adjustable attenuator having directly coupled switched attenuation cells to provide a broad bandwidth, simplified control, and low susceptibility to process variation. The adjustable attenuators disclosed herein are capable of providing multiple levels of attenuation through a series of cells. Attenuation levels may be selected by, for example, switchably connecting in series one or more attenuation cells of various attenuation levels. Thereby, the total attenuation of the adjustable attenuator may be altered resulting in different levels of attenuation. Further, the adjustable attenuator may include connection topologies that remove the need for direct current (DC) blocking capacitors and thereby reduce the reactance of the overall circuit to maximize the effective bandwidth, e.g., extend the low frequency range and improve high frequency roll-off, to provide a broad range of high accuracy linear amplification across a wide spectrum of frequencies. Additionally, amplifier systems including an adjustable attenuator may include attenuation networks (e.g., resistor networks) that compensate for deviations introduced by, for example, manufacturing variation in the fabrication of resistive elements It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Among other things, DOCSIS defines signal parameters for communications transmissions over a cable service infrastructure. The DOCSIS 3.1 specification follows upon an earlier DOCSIS 3.0 specification and includes significant changes to the interface specification for Cable Modems (CM's) and for Cable Modem Termination Systems (CMTS's). In a system for data over cable service, multiple sites, or customer premises, are typically connected to a common waveguide medium, such as a coaxial cable, that terminates at a hub operated by a cable operator. Each of the customer premises has one or more cable modems that receive data signals from the hub in a downstream direction and transmit data signals to the hub in an upstream direction. A cable modem termination system is placed at the hub and receives the individual upstream data signals from the cable modems and transmits the downstream data signals. Every data signal transmission is received by all other stations, CM's or the CMTS, coupled to the common (i.e., shared) medium. The data signals, downstream and upstream, include addressing information identifying to which cable modem they pertain, and each cable modem on the common medium generally ignores data signals not intended for it.

The following discussion generally involves upstream transmission signals and equipment. The cable modems on a common medium receive instructions from the CMTS directing the cable modems as to signal formatting and transmission parameters each cable modem is to use for its upstream transmissions. In particular, once associated with the network, each cable modem only transmits upstream data signals when capacity on the shared medium is assigned, or allocated, to it by the CMTS. DOCSIS 3.0 standardized upstream transmissions by the cable modems in two potential modes, TDMA mode and S-CDMA mode. Each mode includes frequency and time slot allocations to the cable modems, i.e., Frequency Division Multiple Access (FDMA) and Time Division Multiple Access (TDMA). The CMTS communicates frequency and time allocations in a particular Media Access Control (MAC) Management Message known as a bandwidth allocation map (MAP) message.

Time allocations are given in mini-slots that are an integer multiple of 6.25 microseconds (μS). Modulation to be used by the cable modem is also assigned by the CMTS and is communicated in an Upstream Channel Descriptor (UCD) of a MAC Management Message. The fundamental upstream modulation scheme is quadrature amplitude modulation (QAM) with a constellation size up to 128, and the coding scheme includes Reed-Solomon (R-S) Forward Error Correction (FEC) coding, also with Trellis Coded Modulation (TCM) in North America. The S-CDMA mode further incorporates Synchronous Code Division Multiple Access (S-CDMA) as part of the modulation scheme.

According to DOCSIS 3.0, the spectrum available for allocation to upstream transmissions is from 5 MHz up to 85 MHz, just over four octaves. Depending upon the number of channels allocated, a cable modem must support a data signal transmission burst with power output (to a 75 Ohm medium, e.g., coaxial cable) per channel up to 53 dBmV or 56 dBmV in S-CDMA mode, and possibly up to 61 dBmV in TDMA mode. Power output from each cable modem is also controlled by the CMTS. In a process called ranging, the CMTS instructs each cable modem to increase or decrease transmission power such that upstream data signals arriving at the CMTS arrive with substantially the same signal levels regardless of which cable modem sent the signals. Cable modems that are further away from the CMTS on the shared medium may need to transmit with higher power to compensate for additional attenuation associated with a physically longer propagation along the length of the cable. Cable modems closer to the CMTS, along the shared medium, may need to transmit with lower power because their signals travel a shorter distance along the cable, causing less attenuation.

Evolution in the cable industry has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the frequency range supported by DOCSIS 3.0, covering more than five and a third octaves. In addition to the extended frequency ranges and accordingly expanded bandwidths, DOCSIS 3.1 brings new modulation and coding schemes into the cable data services industry. DOCSIS 3.1 implements orthogonal frequency division multiple access (OFDMA) into the upstream channels, and allows allocation by the CMTS to the CM of a frequency range, rather than individual channels, and within the frequency range there are multiple subcarriers of either 25 kHz or 50 kHz spacing. To allow for backwards compatibility, a CMTS may continue to allocate channels within DOCSIS 3.0 frequency ranges, modulation, and coding schemes. Additionally, full compliance with DOCSIS 3.1 requires support for power output up to 65 dBmV into 75 Ohm loads across the entire spectrum. Cable modem manufacturers may further require higher output signal levels, of, for example, 68 dBmV or higher.

The DOCSIS 3.1 specification also has strict requirements for Noise Figure (NF), Modulation error ratio (MER) and spurious emissions across the entire spectrum. Conventional cable modems have not been able to meet the DOCSIS 3.1 specifications over the full 5-204 MHz spectrum and have instead implemented only the newer modulation scheme of the DOCSIS 3.1 specification over a conventional spectrum range of up to 42 MHz or up to 85 MHz. In the near future, however, demand will increase to the point that cable modem manufacturers will be required to support the full spectrum of the DOCSIS 3.1 specification from 5-204 MHz.

In addition to the requirement to support power output up to 65 dBmV into 75 Ohm loads across the entire upstream spectrum from 5-204 MHz with accompanying noise figure, modulation error ratio, and spurious emissions limitations, a cable modem also must be capable of adjusting upstream output power to accommodate ranging operations of the CMTS, i.e., to adjust output power as instructed by the CMTS such that the data signals received at the CMTS from all cable modems in the system arrive with substantially the same power. A typical cable modem may provide an output power adjustable in 1 dB steps from about 5 dBmV up to about 64 dBmV, with various noise figure, modulation error ratio, and spurious emission limits, across the DOCSIS 3.0 spectrum with a high end frequency of 42 MHz or 85 MHz. As described above, DOCSIS 3.1 more than doubles this high end frequency to 204 MHz, while maintaining the lower edge of 5 MHz, with similarly stringent noise figure, modulation error ratio, and spurious emission limits.

Radio Frequency (RF) power amplifier manufacturers for the cable modem industry are challenged to design amplifiers capable of providing adjustable signal output powers spanning 58 dB or more (e.g., 10-68 dBmV at 75 Ohms) across a frequency band spanning more than 5 octaves (e.g., 5-204 MHz), while maintaining stringent noise figure and modulation error ratio requirements across all output signal levels and frequencies. Additionally, at least because cable modems connect to a shared medium, they are desired to behave well in other aspects, such as to present a consistent impedance to the cable to reduce signal reflections, and to limit spurious emissions.

Each of various frequency spectrum allocations made under DOCSIS 3.0 and 3.1 specifies at least one pair of low and high edge frequencies for a transmit range and for a receive range. The terms transmit and receive as used herein are from the perspective of a cable modem. That is, a transmit frequency range is an upstream range, for data signals sent from a cable modem (CM) to a cable modem termination system (CMTS), and a receive frequency range is a downstream range, for data signals sent from the CMTS to one or more CM's.

FIG. 1 is a schematic diagram for data over cable service in a residential environment implemented with a hybrid fiber-coax infrastructure. Shown in FIG. 1 are three distribution branches 100 serving multiple houses, or customer premises 110, each connected by at least one drop 120 from one of the distribution branches 100. Each customer premises 110 has a cable modem connected to a coaxial cable. Customer premises 110 that are connected via the same distribution branch 100 share a coaxial medium 130 in the neighborhood, such that all data signal transmissions on the shared coaxial medium 130 may be observed at, and may have an impact upon, other cable modems connected to the shared coaxial medium 130. In a hybrid fiber-coax system like that shown in FIG. 1, each distribution branch 100 coaxial medium 130 connects to an optical node 140 that converts radio frequency (RF) electrical signals from the coaxial medium 130 to optical signals on a fiber optic cable 150, and vice versa. The fiber optic cable 150 delivers the optical signals to a cable modem termination system (CMTS) 160. For purposes of the disclosure herein, the cable modems may be considered to communicate directly with the CMTS 160 via electrical radio frequency signals on the coaxial medium 130. Beyond the CMTS 160, and as shown for example in FIG. 1, the CMTS 160 may communicate with a regional router 170 and ultimately to a further network 180. Other examples of data over cable services may include other equipment and may provide services to commercial rather than residential customer premises.

Figure 2:
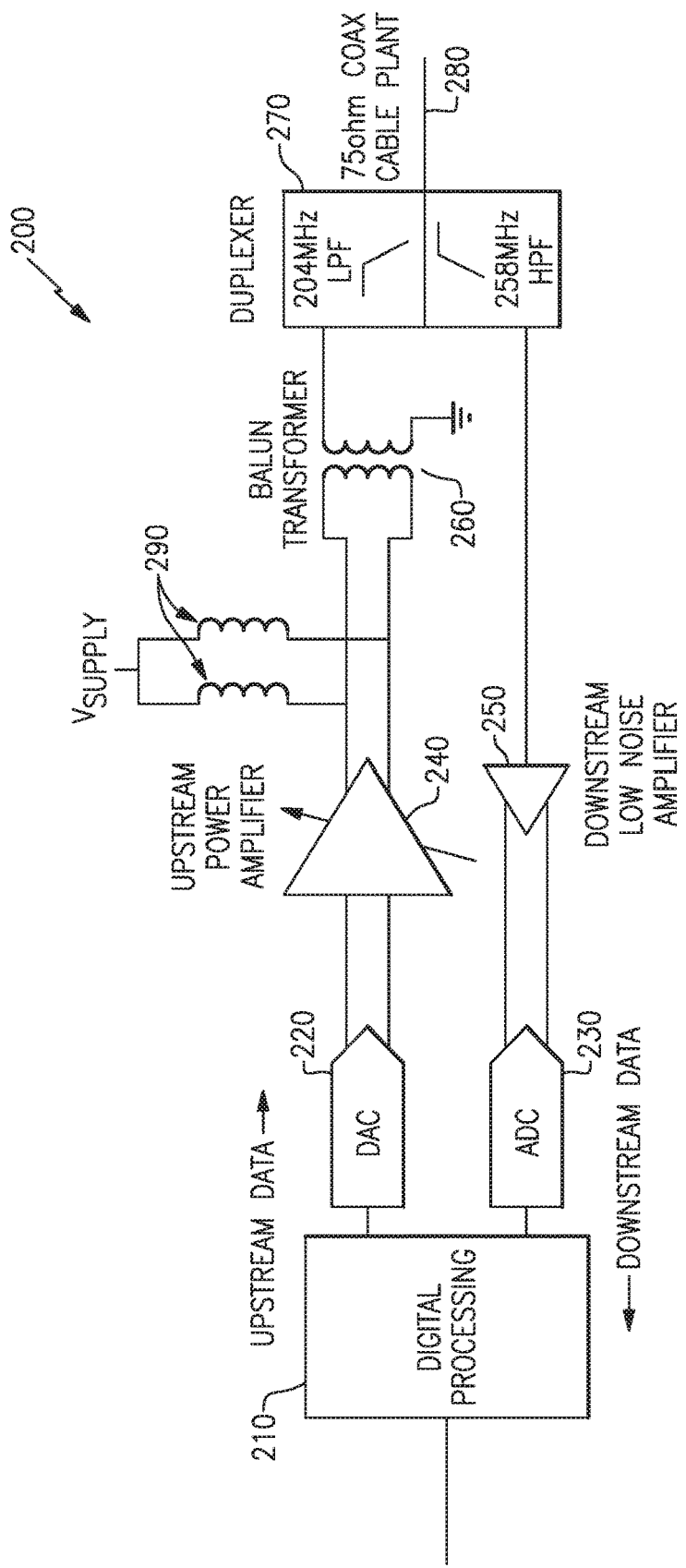
FIG. 2 is a schematic diagram of a cable modem.

FIG. 2 is a simplified schematic diagram of an example of a cable modem. The cable modem 200 transmits upstream data signals to a CMTS 160 (see FIG. 1) and receives downstream data signals from the CMTS 160. The cable modem 200 includes a signal processor 210 that processes received downstream data signals and generates upstream data signals for transmission. The signal processor 210 may operate in a digital domain and the cable modem 200 may further include a digital to analog converter (DAC) 220 that converts the upstream signals into an analog form, and an analog to digital converter (ADC) 230 that converts the downstream signals into digital form. An upstream amplifier 240 amplifies the upstream data signals to a power level sufficient for the upstream data signals to reach the CMTS with enough signal strength for the CMTS to reliably receive the upstream data signals. A downstream amplifier 250 amplifies received downstream data signals (from the CMTS) to a sufficient level for the signal processor 210 to reliably receive the downstream data signals. It should be appreciated that, for clarity, additional circuitry may be included that is not shown, such as up-converters for the transmit side and down-converters for the receive side, for example. The downstream amplifier 250 is typically a low noise amplifier (LNA) configured to sufficiently amplify the relatively low signal level of the received downstream data signal without adding significant noise. The output of the upstream amplifier 240 is coupled through a balun 260 to a duplexer 270 that couples the upstream data signals to a coaxial cable 280, which is further operatively coupled to a shared coaxial medium 130 of FIG. 1. The duplexer 270 also couples the downstream data signals from the coaxial cable 280 to provide the downstream data signals to the downstream amplifier 250. The duplexer 270 may include frequency selective filters to separate the downstream data signals arriving via the coaxial cable 280 from the upstream data signals being provided to the coaxial cable 280. As shown in FIG. 2, the upstream amplifier 240 may be implemented as a differential amplifier having differential inputs (e.g., each of a positive and a negative input, or two inputs accommodating a magnitude difference) and having a differential output (e.g., each of a positive and a negative output, or two outputs providing a magnitude difference). Additionally as shown in FIG. 2, the differential sides of one or more internal components of the upstream amplifier 240 may be coupled to a power supply voltage by each of a pair of electrical elements, for example, inductors 290.

According to aspects disclosed herein, the cable modem 200 supports the full upstream frequency range of DOCSIS 3.1 from 5 MHz up to 204 MHz with selectable output signal power controlled in multiple steps. In at least one embodiment, the cable modem 200 and the upstream amplifier 240 support output signal power up to 68 dBmV into a 75 Ohm coaxial cable with at least fifty nine (59) output signal power settings differing by a nominal 1 dB variation between adjacent settings. In some embodiments, the upstream amplifier 240 may include a multi-chip module including a substrate with one or more die to implement various features of the upstream amplifier 240. In some embodiments the upstream amplifier 240 may be included in a module that also includes the downstream amplifier 250.

In some embodiments, the upstream amplifier 240 may provide a combination of amplification and attenuation to provide a plurality of distinct output signal power settings. In one example, the number of output signal power settings is fifty-nine. For example, the output signal power settings may span from a minimum output signal power of 10 dBmV up to 68 dBmV, selectable in nominal 1 dB increments, for example, or may span other output signal powers or may provide alternate selectable increments. In at least one embodiment, the upstream amplifier 240 provides a gain range of −23 dB to +35 dB.

An amplifier, such as the upstream amplifier 240, may be formed as an assembly, e.g., an amplifier assembly, of one or more stages having various functions and may include control components, e.g., a controller, that controls aspects of the stages and may have a communication interface to receive configuration parameters and instructions. The terms amplifier, amplifier assembly, and amplifier system may at times be used interchangeably herein and generally refer to one or more stages coupled to receive an input signal and to provide an output signal varying in signal level or power level. The terms amplifier, amplifier assembly, and amplifier system may at times refer to objects that include control components in combination with the one or more stages.

Figure 3:
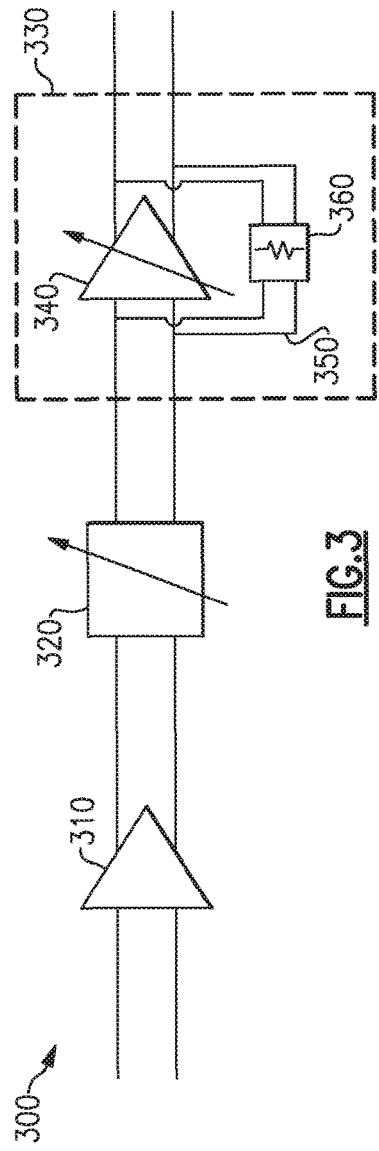
FIG. 3 is a schematic diagram of an example of an amplifier system.

FIG. 3 illustrates an amplifier system 300 that is an amplifier assembly including an input stage 310, an adjustable attenuator 320, and an output stage 330. The input stage 310 may include a fixed gain amplifier, which may be a low noise amplifier (LNA). The adjustable attenuator 320 may have a range of selectable attenuation levels that may include a 0 dB attenuation level such that, when selected, the adjustable attenuator 320 passes signals from its input to its output substantially without attenuation, and the adjustable attenuator 320 may provide levels of attenuation in, for example, 1 dB steps, up to a maximum attenuation, such as 34 dB of attenuation, for example.

The output stage 330 is an adjustable gain element (e.g., variable gain amplifier circuit) including a variable gain amplifier 340 and a bypass path 350. The bypass path 350 may include a fixed attenuator 360. The variable gain amplifier 340 and the bypass path 350, each part of the output stage 330, may be alternatively selected to provide an adjustable gain from, for example, −4 dB up to 20 dB, thus providing a 24 dB range of selectable gain settings. With such an output stage 330, in combination with the adjustable attenuator 320 that may provide a 35 dB range, the amplifier system 300 provides a 59 dB range of overall gain variability.

In at least one embodiment, the input stage 310 provides a fixed 15 dB gain, the adjustable attenuator 320 is a digital switched attenuator (DSA) that provides a range of attenuation from 0 to 34 dB in nominal 1 dB increments, the fixed attenuator 360 is a loss pad that provides 4 dB of attenuation, and the variable gain amplifier 340 provides a selectable gain of 4, 12, or 20 dB by enabling a varying number of amplifier elements as discussed in more detail below. It is to be appreciated that the amplifier and attenuator components may be designed and constructed to provide any set of amplification gain and/or attenuation values, and embodiments described herein are not limited to the specific examples of gain and attenuation values or ranges described. Additionally, embodiments of an amplifier system may include additional bypass path circuitry providing different attenuation values or no attenuation, e.g., the bypass path 350 may not have a fixed attenuator 360 and instead may pass a signal substantially without attenuation, or there may be no bypass path 350. Additionally, the variable gain amplifier 340 may provide alternate gain values, including negative gain values, and may provide higher or lower gain values than those explicitly described herein, and may provide more or fewer than three amplify modes as described herein, in any combination to provide variable output signal levels to accommodate varying applications and operational requirements.

Continuing with the particular above-described embodiment, examples of operating states are described that provide for gain settings ranging from a minimum net gain of −23 dB up to a maximum net gain of +35 dB. The minimum net gain of the amplifier system 300 is provided when the adjustable attenuator 320 is set to provide maximum attenuation (34 dB in this example) and the output stage 330 is configured to route a signal through the bypass path 350 that includes the fixed attenuator 360. The resulting net gain of −23 dB is the combination of 15 dB gain of the input stage 310, −34 dB gain of the adjustable attenuator 320, and −4 dB gain of the fixed attenuator 360.

The maximum net gain of the amplifier system 300 is provided when the adjustable attenuator 320 is set to provide 0 dB of attenuation and the output stage 330 is configured to route a signal through the variable gain amplifier 340 set to provide 20 dB of gain. The resulting net gain of +35 dB is the combination of 15 dB gain of the input stage 310 and 20 dB gain of the variable gain amplifier 340. The adjustable attenuator 320 passes a signal without attenuation (0 dB) when the amplifier system 300 is in a maximum gain operating state. For clarity, the gain settings of the input stage 310, the adjustable attenuator 320, and the output stage 330 are shown in Table 1 for the minimum and maximum net gain operating states of this example of the amplifier system 300.

TABLE 1

| Input Stage 310 | Attenuator 320 | Output Stage 330 | Net Gain |
|---|---|---|---|
| +15 dB | −34 dB | −4 dB | −23 dB |
| +15 dB | 0 dB | +20 dB | +35 dB |

Intermediate gain values, between the minimum and maximum net gain of the amplifier system 300 overall, e.g., gain values between −23 dB and +35 dB in the example discussed above, may be achieved by varying combinations of gain settings for the adjustable attenuator 320 and the output stage 330.

In combination, the bypass path 350 having a fixed attenuator 360 and the variable gain amplifier 340 having three gain states, result in four modes of operation for output stage 330. In a first mode, which is a bypass mode, a signal is routed through the bypass path 350 and not routed through the variable gain amplifier 340. In this mode the signal travels through the fixed attenuator 360, resulting in a 4 dB attenuation applied by the output stage 330, for example. In addition to the bypass mode, there are three amplify modes wherein the signal is routed through the variable gain amplifier 340 and not routed through the bypass path 350. In each of the amplify modes, the signal is routed through the variable gain amplifier 340 that applies a respective gain to the signal. In one example of the amplifier system 300 discussed above, in the first amplify mode the variable gain amplifier 340 applies a 4 dB gain to the signal, in the second amplify mode the variable gain amplifier 340 applies a 12 dB gain to the signal, and in the third amplify mode the variable gain amplifier 340 applies a 20 dB gain to the signal.

Figure 4:
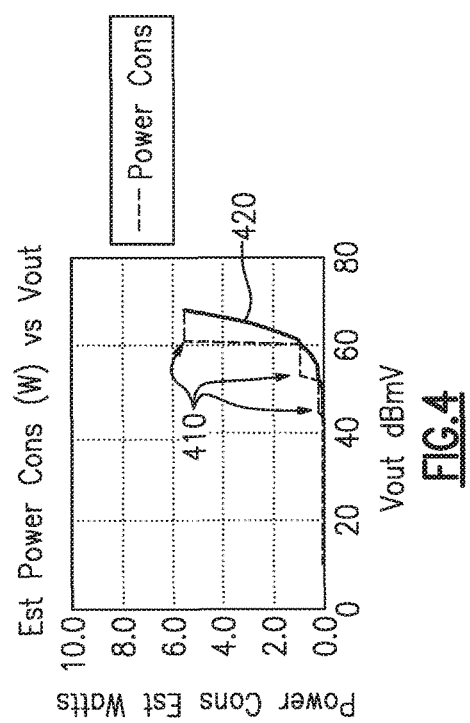
FIG. 4 is a graph of estimated power consumption for an amplifier system.

FIG. 4 is a graph of estimated power consumption versus output signal levels. The steps 410 on this graph represent increasing power requirements, from left to right, of the variable gain amplifier 340 as the output stage 330 mode changes from the bypass mode, to the first, second, and third amplify modes, respectively.

As shown in FIG. 4, the amplifier system 300 has reduced power requirements at lower output signal levels. At least in part, power reductions are achieved for lower desired output signal levels by reducing amplification of the variable gain amplifier 340, which is accomplished by disabling one or more unit cells of semiconductors, transistors, or other amplifier elements when the desired output signal level is relatively low, as discussed in more detail below. In some embodiments, power consumption is further reduced by adjusting an amplifier bias signal, which may be a bias current or a bias voltage, to increase efficiency.

The variable gain amplifier 340 may be coupled to a power supply that may provide source power to the variable gain amplifier 340 in the form of a bias current, which ultimately provides the power of the output signal provided by the variable gain amplifier 340. The bias current provided to the variable gain amplifier 340 may be varied based on the needs of the variable gain amplifier 340 for a particular output level setting of the amplifier system 300. For example, the first, second, and third amplify modes of the variable gain amplifier 340 may not each require the same amount of bias current to provide the first, second, and third amplification gains, for example, 4 dB, 12 dB, and 20 dB. Further efficiency may be achieved, in some embodiments, by adjusting the bias current for a particular amplification gain based upon the particular output level setting. For example, the third amplify mode of the variable gain amplifier 340 may be utilized to provide eight distinct output power levels. While there are eight such settings, for example, in which the variable gain amplifier 340 provides a gain of 20 dB, the bias signal provided to the variable gain amplifier 340 may be adjusted for each of the eight settings, to result in more efficient power consumption, based upon a desired output power level setting being achieved by varying the adjustable attenuator 320, which reduces the signal level at the input of the variable gain amplifier 340.

For a selected output signal level, and in at least one embodiment, an amplifier bias signal may be determined that provides enough power to the variable gain amplifier 340 to provide the desired output signal level with sufficient linearity and/or noise characteristics without providing additional power beyond that required. An amplifier bias signal determined necessary for a particular output signal level may be lower than an amplifier bias signal determined necessary for a different output signal level, even for the same gain characteristic of an amplify mode of the variable gain amplifier 340. Each determined value of bias current, e.g., for different desired output signal levels, may be recorded in a storage element, such as a lookup table, a register, or similar, and retrieved by a controller, for example, to control the bias current provided for each output signal level setting. In the example of the amplifier system 300 discussed above, there are a range of amplification and output signal levels for which a transmit signal is routed through the variable gain amplifier 340. When the transmit signal is routed through the variable gain amplifier 340, the variable gain amplifier 340 operates in one of the first, second, or third amplify modes to provide a gain of 4 dB, 12 dB, or 20 dB, respectively. Within any of these three amplify modes, the bias current provided to the variable gain amplifier 340 may be controlled or varied to optimize power consumption for varying output signal levels, thereby reducing power consumption between amplify modes.

FIG. 4 includes a smooth curve 420 that incorporates an adjusted bias current for each net gain, e.g., for differing output signal level settings. The dashed line plotted in FIG. 4 illustrates power consumption of the amplifier system 300 if a bias current is provided at a maximum amount for each amplify mode, and the solid curve plotted in FIG. 4 is the adjusted power consumption when an adjusted bias current is incorporated as discussed above. It is to be appreciated that while the example of the amplifier system 300 discussed above includes three amplify modes, each of which is used to provide a set of eight overall gain values, and accordingly a set of eight output signal levels, this is merely an example of one set of such values. Other embodiments of an amplifier system in accord with aspects and embodiments described herein may include more or fewer amplify modes with more or fewer gain settings, and various gain values and output signal levels may be provided by one or more amplify or bypass modes.

An amplifier system in accord with aspects and embodiments described herein may be implemented in a number of physical technologies and topologies. An amplifier system may include an input stage amplifier, an adjustable attenuator, a variable gain amplifier, and a bypass path signal path, or any combination or subset of these, implemented in various arrangements and manufactured from various techniques. Any of these components may be implemented in a substrate or in a die and may be designed for and manufactured from various semiconductor materials, such as Silicon (Si), Germanium (Ge), Gallium arsenide (GaAs), for example, using various design technologies, such as complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other materials and technologies.

In at least one embodiment, an amplifier system may include a fixed gain amplifier implemented on a GaAs ED-pHEMT die, a digital switched attenuator (DSA) implemented on an SOI die, a variable gain amplifier implemented on a BCD-LDMOS die, and a controller implemented on a bulk CMOS die. Each of the dies may be mounted upon or coupled to a substrate with interconnections to each other within the substrate, or by other conducting materials, to convey signals between the various inputs, outputs, and controlled elements of each die, and the set of dies on the substrate may be packaged into a multi-chip module (MCM) with a physical format suitable for incorporation into a device, such as a cable modem, by, for example, mounting and/or soldering to a circuit board.

Figure 5:
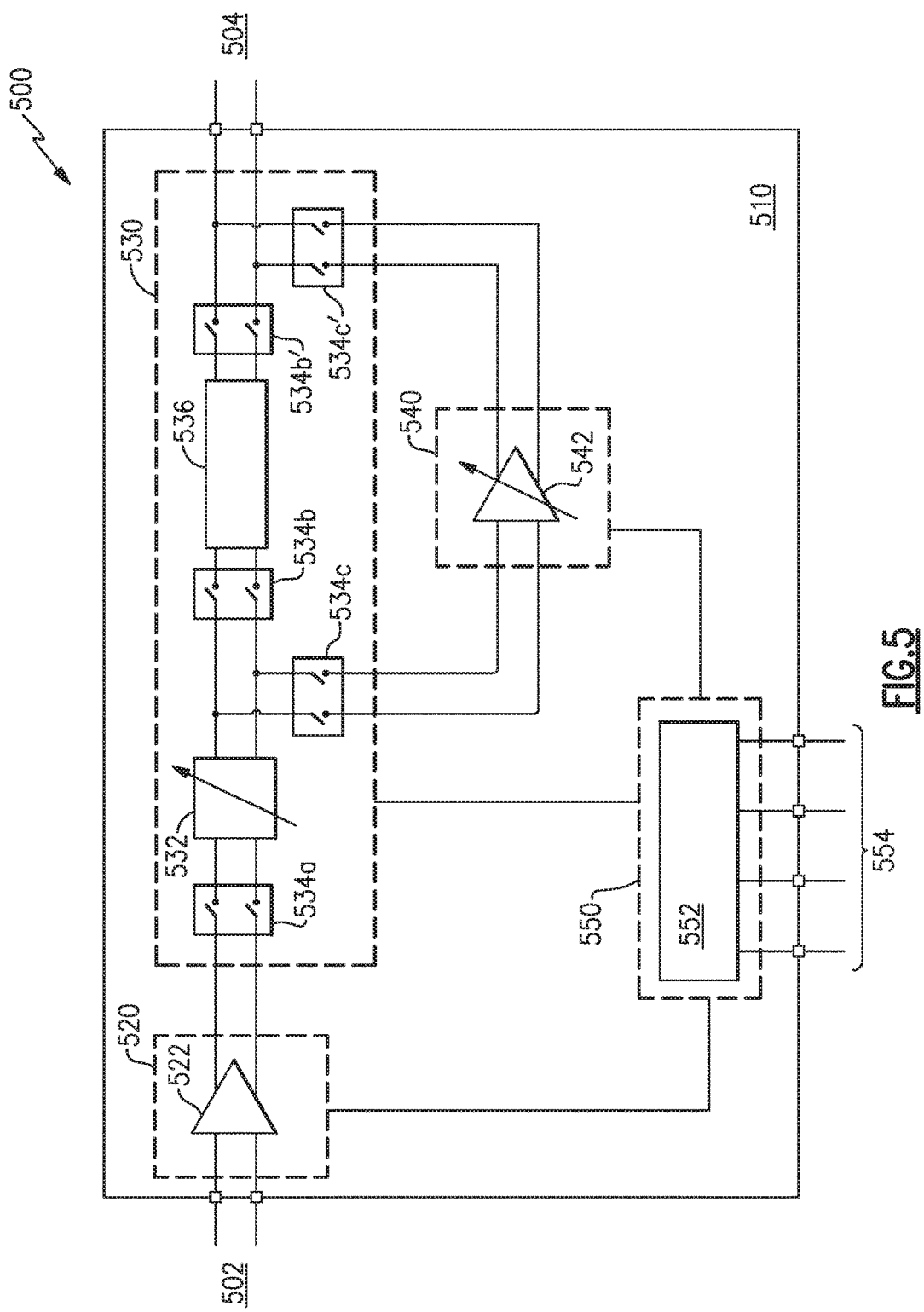
FIG. 5 is a schematic diagram of another example of an amplifier system.

FIG. 5 shows an example of an amplifier system 500, similar in manner to the amplifier system 300 described above with respect to FIG. 3, implemented as a multi-chip module. The amplifier system 500 has an input 502 for receiving balanced differential transmit signals and an output 504 for providing balanced differential transmit signals of differing signal levels. The amplifier system 500 includes multiple chip dies, as described individually in more detail below, provided on a substrate 510. A first die 520 is coupled to the input 502 and includes a fixed gain amplifier 522, such as the fixed gain amplifier of the input stage 310 of FIG. 3. A second die 530 is coupled to the output of the fixed gain amplifier 522 and includes a switch 534a that selectively couples the output of the fixed gain amplifier 522 to an adjustable digital switched attenuator 532 (such as the adjustable attenuator 320 of FIG. 3), and switches 534b, 534c that selectively route the transmit signal from the output of the digital switched attenuator 532 to either of a fixed attenuator 536 (such as the fixed attenuator 360 of FIG. 3), which may be a loss pad, in a bypass mode, or to a third die 540 that includes a variable gain amplifier 542 (such as the variable gain amplifier 340 of FIG. 3), in an amplify mode.

The switches 534 may be multiple switches as shown or may be fewer switches implemented with, e.g., single-pole double-throw switches that alternately make a connection to one or another signal path. In some embodiments, some of the switches 534 may be configured to enable a signal path upon receiving a particular control signal and others of the switches 534 may be configured to disable a signal path upon receiving a similar control signal. In some embodiments, inverters may be provided such that a single control signal may cause some of the switches 534 to enable a signal path and cause others of the switches 534 to disable a signal path. The switches 534 may be implemented as transistors or any suitable technology.

The amplifier system 500 also includes a fourth die 550 that includes a system controller 552 that provides control signals to components included on one or more of the first, second, and third dies. For example, the system controller 552 may communicate with or control the attenuation settings of the digital switched attenuator 532, control amplify modes and gain values of the variable gain amplifier 542, control or adjust a bias level (e.g., current or voltage) provided to the variable gain amplifier 542 or the fixed gain amplifier 522, and control the switches 534 to place the output stage in bypass mode or amplify mode and to establish the overall net gain of the amplifier system 500. The system controller 552 may control the various components based upon instructions it receives via a control interface 554. The amplifier system 500 may have, for example, the specifications described in Table 2.

TABLE 2

| | |
|---|---|
| Frequency Range | 5 MHz to 204 MHz |
| Input Stage | Fixed Gain Amplifier (e.g., Low Noise Amplifier) |
| | Gain: 15 dB (fixed) |
| | Noise FIG.: 1 dB |
| | Input IP3: 15 dBm |
| | Output IP3: 30 dBm |
| Adjustable Attenuator | Selectable 0-34 dB attenuation in 1 dB steps |
| Output Stage | Variable Gain Amplifier |
| | Gain: 4, 12, 20 dB (selectable) |
| | Noise FIG.: 10, 9, 8 dBm |
| | Input IP3: 30 dBm (all gain settings) |
| | Output IP3: 34, 42, 50 dBm |
| | Bypass Path |
| | 4 dB Loss Pad |

An amplifier system, such as the example of the amplifier system 500, may be provided in the form of a multi-chip module (as described above) to provide amplification of a signal in a first direction. The multi-chip module may also include additional amplifier components for amplification of a signal in a second direction. For example, at least one embodiment includes a multi-chip module having a first input and output for a transmit signal and having a second input and output for a receive signal. The multi-chip module may include an amplifier system to amplify a transmit signal from the first input and provide an amplified transmit signal to the first output, and may also include a receive signal amplifier, such as the low noise amplifier 250 illustrated in FIG. 2, to amplify a receive signal from the second input to provide an amplified receive signal at the second output. With respect to FIG. 5, in at least one embodiment, the first die 520 is implemented with GaAs ED-pHEMT technology, the second die 530 is implemented with SOI technology, the third die 540 is implemented with BCD-LDMOS technology, and the fourth die 550 is implemented with CMOS technology.

In at least one embodiment, an amplifier system may be provided as a packaged multi-chip module, with packaging such as an overmold that substantially encapsulates a substrate and various dies and components thereon, and including connectivity to the exterior of the packaging to provide signal and control interconnections. An amplifier system in accord with aspects and embodiments described herein may be provided on a single chip or die and may be packaged into a chip-scale package. Any of an amplifier system, multi-chip module, or chip-scale package as described herein may be used as an upstream amplifier for, e.g., a DOCSIS cable modem, or as a selectable-gain signal amplifier for any suitable application, such as a radio frequency amplifier or part of a front-end module. Component characteristics may be altered to provide an amplifier system in accord with aspects and embodiments described herein to provide amplification across a number of frequency ranges, gain values, output levels, linearity, noise characteristics, and other performance criterion to be suitable for various applications and changing operational parameters.

Referring again to FIG. 5, the system controller 552 provides control signals to various components of amplifier systems as described herein. For example, a controller may provide control signals to control attenuation settings, gain settings, signal routing switches, power supply (e.g., bias) settings, and other components to establish operational characteristics of an amplifier system. A controller, such as the system controller 552, may establish operational characteristics of the amplifier system in response to commands from another device or component, such as the signal processor 210 of FIG. 2. Accordingly, such a controller may have a control interface, such as the control interface 554. Additionally, a controller may control the timing of changes applied to various components to prevent or reduce conflicts, electrical shorts, spurious emissions, signal transients, disallowed or undesirable states, or changes in input or output impedances, and the like. Examples of a control interface 554 include, but are not limited to, a serial peripheral interface (SPI) or serial data interface (SDI), general purpose input/output (GPIO), mobile industry processor interface (MIPI), or the like. Additionally, the controller may control the various components of the amplifier system via direct or indirect control lines or via similar communication interfaces to those described above coupled to other controllers associated with the component being controlled. For example, an adjustable digital switched attenuator may have its own controller in communication with the amplifier system controller and/or a variable gain amplifier may have its own controller in communication with the amplifier system controller.

An adjustable attenuator, such as the adjustable attenuator 320 of FIG. 3 above, or a digital switched attenuator, such as the digital switched attenuator 532 of FIG. 5 above, may be formed from one or more attenuation cells. FIG. 6 illustrates an example attenuation cell 600 constructed to receive an input signal and provide an output signal. As illustrated in FIG. 6, the attenuation cell 600 receives the input signal at an attenuation cell input 602 and provides the output signal at an attenuation cell output 604. It is appreciated that the attenuation cell 600 may be symmetrical and, thereby, function identically for signals received at either port.

The attenuation cell 600 includes a resistive network 606 coupled in parallel with a bypass switch 608 and coupled to the signal path by one or more attenuation switches 610. The resistive network 606 includes a shunt terminal connected to a shunt switch 612. Depending upon the resistive network 606, and in various embodiments, additional shunt terminals may be connected to additional shunt switches.

The attenuation cell 600 may operate in an attenuation mode by closing the attenuation switches 610a, 610b (i.e., conducting), and opening the bypass switch 608 (i.e., non-conducting), resulting in an input signal being directed through the resistive network 606, which will reduce a power level of the input signal by action of the resistive network 606. In embodiments, the shunt terminal of the resistive network 606 is coupled to ground through the shunt switch 612 in a closed (conducting) state.

The attenuation cell 600 may operate in a bypass mode by closing bypass switch 608 to bypass the resistive network 606 and provide an output signal that is substantially the same as the input signal.

In the example illustrated in FIG. 6, there are two attenuation switches 610 and one shunt switch 612 connected to the resistive network 606. The attenuation switches 610a, 610b respectively connect the resistive network 606 to the attenuation cell input 602 and the attenuation cell output 604. The shunt switch 612 connects a third terminal of the resistive network 606 to a reference node, which is a ground reference potential in the example of FIG. 6 but could be an alternate potential or a floating potential.

The attenuation switches 610 and shunt switch 612 isolate the resistive network 606 from the remainder of the attenuation cell 600 when open (i.e., non-conducting), and thereby remove the resistive network 606 from the signal path when the attenuation cell 600 is in bypass mode or in an isolated (i.e., open circuit) mode. Further, by isolating the resistive network 606 from the signal path, parasitic losses caused by the resistive network 606 are reduced when operating in bypass mode.

The bypass switch 608, the attenuation switches 610, and the shunt switch 612 may be constructed in a variety of manners depending upon the particular implementation. Any of the bypass switch 608, the attenuation switches 610, and the shunt switch 612 may be implemented as a single transistor or other component capable of being selectively placed in a conducting state or a non-conducting state. A transistor, such as a Field Effect Transistor (FET), a Bipolar Junction Transistor (BJT), or others, may be a suitable component. Additionally, in embodiments, other elements may be used, such as Microelectromechanical System (MEMS) Switches, diodes, diode connected transistors, PIN diodes, etc. In embodiments, multiple elements or components may be connected together to form any of the bypass switch 608, the attenuation switches 610, and the shunt switch 612.

In FIGS. 7A-7B, examples of a switch 700 are constructed by connecting a plurality of Field Effect Transistors $T_1$-$T_n$ in series. The plurality of series-connected transistors, as opposed to a single transistor, may provide additional isolation when off (non-conducting) than may be provided over fewer transistors or by only one transistor. Additionally, a plurality of transistors in series may accommodate a higher input power as the signal voltage level is distributed across more transistors, reducing the possibility of voltage breakdown in any of the transistors, when necessary. Also shown in FIGS. 7A-7B is that the transistor gates are tied together to form a control input such that a control voltage applied to any of the gates is effectively applied to all the gates, thereby controlling the conducting or non-conducting state of the transistors. Additionally as shown, the gates of the individual transistors may be tied together via gate resistances, either as individual gate resistances, such as in FIG. 7A, or as additive series gate resistances, as in FIG. 7B, or any combination of these or other arrangements. Additionally, in embodiments, two or more of the gates may be directly electrically tied to each other without a resistance between them. Any of the bypass switch 608, the attenuation switches 610, and the shunt switch 612 may be formed from the example switch 700 or variations thereof.

The attenuation switches 610 and other elements may themselves attenuate the input signal in addition to the attenuation applied by the resistive network 606 while in attenuation mode. Accordingly, the attenuation provided by the resistive network 606 may be designed to be slightly lower than the total desired attenuation to compensate for attenuation introduced by other elements, such as the switches. An aspect of at least one embodiment includes matching, or balancing, the impact of the bypass switch 608 with the impact of the attenuation switches 610 and/or shunt switch 612 so that the difference in attenuation produced by the attenuation mode as compared to the bypass mode is due solely to the resistive network 606. In other words, when the attenuation cell 600 is switched from bypass mode to attenuation mode, or vice versa, a precise change in the attenuation level will result and is due substantially solely to the attenuation of the resistive network 606.

As described above, the attenuation cell 600 may include a resistive network 606 to attenuate the input signal when the attenuation cell 600 is in the attenuation mode of operation. Various types of resistive networks 606 may be employed depending upon the particular implementation. For example, the resistive network 606 may include a number of options for an attenuator network or circuit topology, as described further below, and elemental values, such as resistance values, may be selected to provide any of numerous attenuation levels, such as, for example, ½ dB, 1 dB, 2 dB, 3 dB, 4 dB, 6 dB, 9 dB, etc.

In embodiments, multiple attenuation cells 600 are coupled together, e.g., in series, as in the digital switched attenuator 1100 of FIG. 11, further discussed below, and may provide a variable attenuation level by controlling the individual attenuation cells 600 to be in attenuation mode or in bypass mode as discussed above. Further, the digital switched attenuator 1100 may be open-circuited by controlling at least one attenuation cell 600 to be in an isolated mode, i.e., open-circuited, by having its bypass switch 608 and at least one of its attenuation switches 610a or 610b in an open (non-conducting) state, so that no signal path is formed between the attenuation cell input 602 and the attenuation cell output 604.

Further, individual attenuation cells 600 include a resistive network 606 that may be a fixed attenuator providing a single constant level of attenuation, a multi-step attenuator configurable between a pre-defined set of attenuation levels, or a variable attenuator that is configurable within a continuous range of attenuation levels.

FIGS. 8A-8C illustrate examples of fixed attenuator circuits suitable to employ as a resistive network 606. FIG. 8A illustrates a T-network circuit topology, FIG. 8B illustrates a Pi-network circuit topology, and FIG. 8C illustrates a Bridged T-network circuit topology. The resistive network 606 may be implemented as one or more of the circuit topologies shown in FIGS. 8A-8C, or may be variations or equivalent circuits of the circuit topologies shown in FIGS. 8A-8C, or may be implemented as other circuit topologies. The impedance elements of the circuit topologies shown in FIGS. 8A-8C, e.g., impedances $R_1$, $R_2$, and $R_3$, may be implemented as pure resistances as shown or may include inductive or capacitive elements in various embodiments.

In at least one embodiment, the bridged T-network of FIG. 8C is used as the model for the resistive network 606. The bridged T-network of FIG. 8C includes two impedances $R_3$ connected in series between the input and the output terminals, a shunt impedance $R_1$ coupled between the two series connected impedances $R_3$ and a third terminal, and a bridge impedance $R_2$ coupled between the input and the output, in parallel with the series connected impedances $R_3$. The values for the impedances $R_1$, $R_2$, and $R_3$ may be determined based on the relationships illustrated in equations (1) below given a desired attenuation level A in dB and a desired characteristic impedance $Z_0$:

$$R_1 = \frac{Z_0}{\sqrt{10^{\frac{A}{10}} - 1}} \Bigg| R_2 = Z_0 * \left(\sqrt{10^{\frac{A}{10}} - 1}\right) \Bigg| R_3 = Z_0 \quad (1)$$

Table 3 illustrates example values for the impedances $R_1$, $R_2$, and $R_3$ to achieve various attenuation steps in a bridged-T resistive network 606 as described above with reference to FIG. 8C, using equations (1) and assuming a desired characteristic impedance $Z_0$=50Ω.

TABLE 3

| Total Attenuation Step | Calculated $R_1$ Shunt Values | Calculated $R_2$ Bridge Values | $R_3$ Values (=$Z_0$) |
|---|---|---|---|
| ½ dB | 843.8 Ω | 2.96 Ω | 50 Ω |
| 1 dB | 409.8 Ω | 6.10 Ω | 50 Ω |
| 2 dB | 193.1 Ω | 12.95 Ω | 50 Ω |
| 3 dB | 121.2 Ω | 20.63 Ω | 50 Ω |
| 4 dB | 85.49 Ω | 29.24 Ω | 50 Ω |
| 6 dB | 50.24 Ω | 49.76 Ω | 50 Ω |
| 9 dB | 27.50 Ω | 90.92 Ω | 50 Ω |

Figure 9:
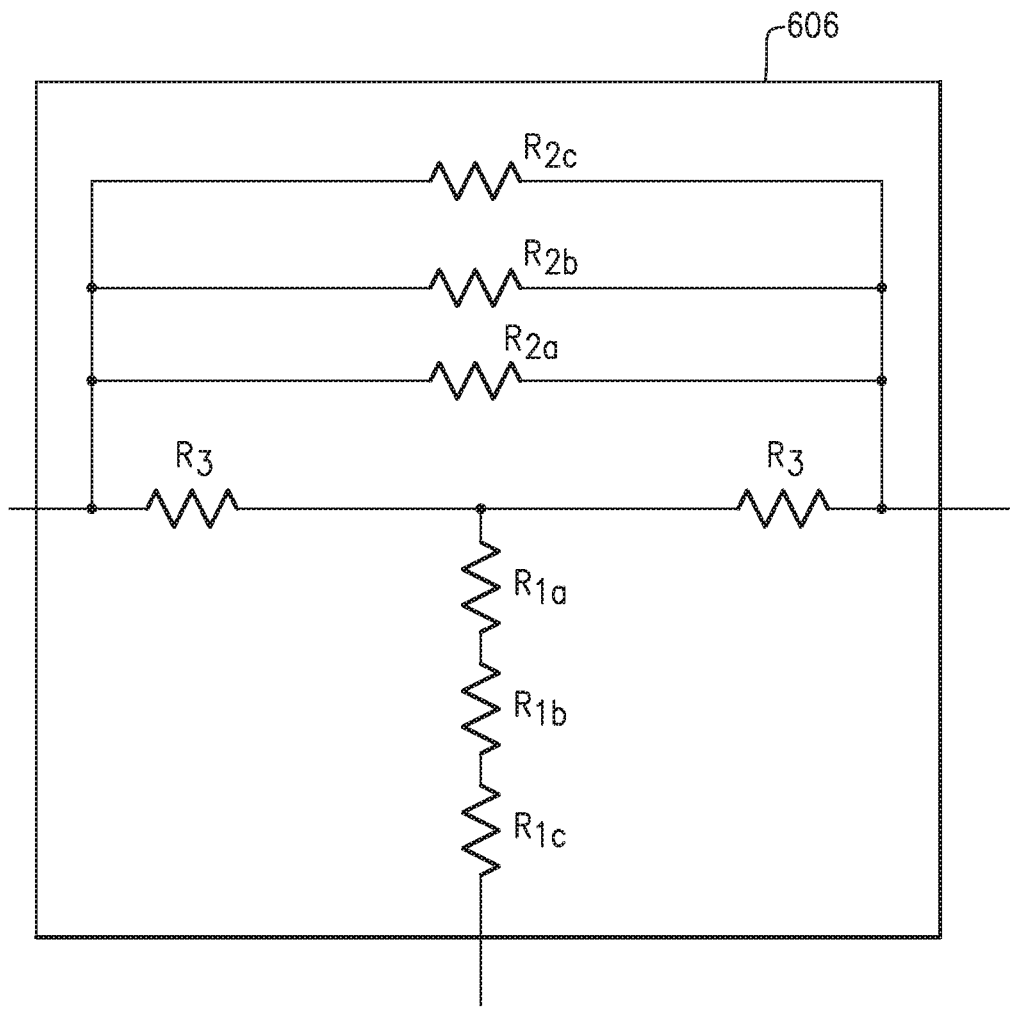
FIG. 9 is a schematic circuit diagram of an example of a resistive network.

The impedances $R_1$, $R_2$, and $R_3$ for each attenuation cell 600, in relation to the resistive network 606 of FIG. 8C and values of Table 3, may be established by a variety of methods depending upon the particular implementation. For example, with reference to FIG. 9, multiple impedances connected in parallel or in series may replace one or more of the single impedances $R_1$, $R_2$, and $R_3$. This approach may be advantageous because it may avoid the use of small impedance values, which generally are more difficult to manufacture with tight tolerances and/or may require more space. With reference to Table 3, attenuators with low attenuation levels, e.g., ½ dB or 1 dB, include relatively high values for $R_1$ and relatively low values for $R_2$. Accordingly, the resistive network 606 of FIG. 9 is shown with series-connected impedances $R_{1a}$, $R_{1b}$, and $R_{1c}$ that yield an additive total value of $R_1$, allowing the component values of $R_{1a}$, $R_{1b}$, and $R_{1c}$ individually to be smaller while achieving a larger value for $R_1$ overall. Comparably, the resistive network 606 of FIG. 9 is shown with parallel-connected impedances $R_{2a}$, $R_{2b}$, and $R_{2c}$ that yield a value of $R_2$ lower than any of $R_{2a}$, $R_{2b}$, and $R_{2c}$ individually. This approach allows fabrication of impedances $R_1$ and $R_2$ (for example, in an integrated circuit) from multiple individual impedances (e.g., $R_{1a}$, $R_{1b}$, $R_{1c}$, $R_{2a}$, $R_{2b}$, and $R_{2c}$) that may allow for more precise and/or more consistent impedances $R_1$ and $R_2$ in the face of manufacturing process variation.

For example, for a desired characteristic impedance $Z_0=50\Omega$, a manufacturing process may be capable of reliably producing a resistive impedance of $50\Omega$, which may reliably produce the impedance $R_3$ for any attenuation level of the attenuation cells 600, as shown in Table 3. With reference to the 1 dB values from Table 3, the impedance $R_1$ is approximately eight times (8×) the value of impedance $R_3$, and the impedance $R_2$ is approximately one-eighth (⅛×) the value of impedance $R_3$. Using the circuit topology of FIG. 9, the impedances $R_1$ and $R_2$ of FIG. 8C may be more reliably produced for a 1 dB attenuation cell by forming R1 from 8 resistors of $50\Omega$ each connected in series and forming R2 from 8 resistors of $50\Omega$ each connected in parallel. More generally, fabricating multiple $50\Omega$ resistors in parallel or in series may be more accurate than fabricating individual resistors of, for example, $25\Omega$ or less and $600\Omega$ or more. Additionally, and as in the 1 dB example, the desired impedances $R_1$ and $R_2$ may not be exact integer values of $R_3$ or another component impedance, but manufacture of multiple component impedances of similar or approximately the same values, though not exactly the same value, will generally yield a more consistent set of equivalent impedances, resulting in a resistive network 606 design that is more immune to process variation during manufacture.

While the resistive network 606 of FIG. 9 is shown with three component impedances $R_{1a}$, $R_{1b}$, and $R_{1c}$ contributing to impedance $R_1$ and three component impedances $R_{2a}$, $R_{2b}$, and $R_{2c}$ contributing to impedance $R_2$, it is understood that the example discussed, and various embodiments, may include more or fewer component impedances for any particular impedance and any particular design of the resistive network 606. In particular, a resistive network 606 may be designed for virtually any desired attenuation level from virtually any available set of component impedances R by applying the aspects and relationships described above.

In at least one embodiment of a resistive network 606, the impedances $R_1$, $R_2$, and $R_3$ are designed to be resistances, as shown, without any intentional reactive component. Accordingly, such a resistive network 606 is substantially frequency independent.

Figure 10:
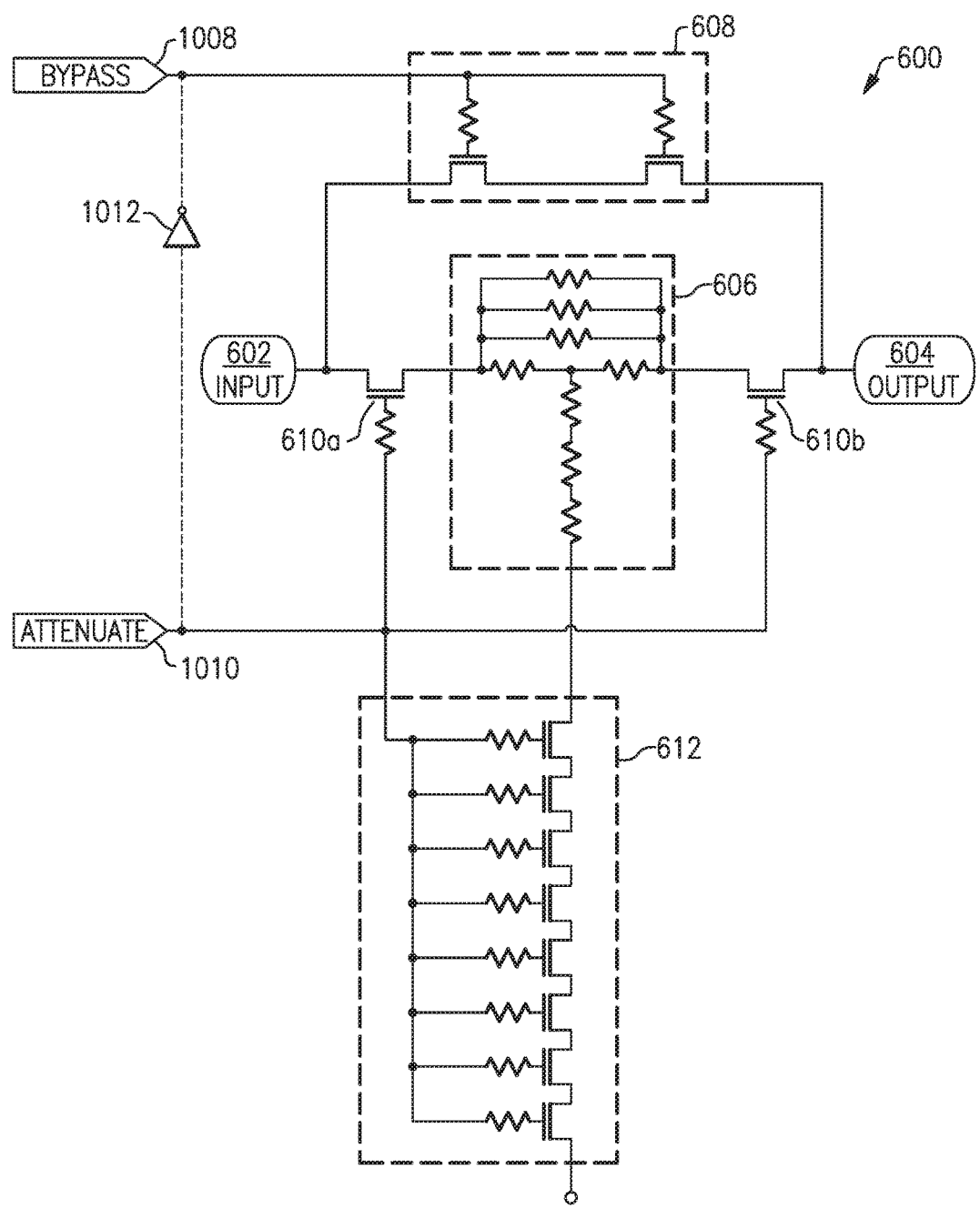
FIG. 10 is a schematic circuit diagram of the example attenuation cell of FIG. 1 including example digital switches of FIG. 2 and the example resistive network of FIG. 4.

FIG. 10 illustrates an embodiment of an attenuation cell 600 including an attenuation cell input 602, an attenuation cell output 604, a resistive network 606, a bypass switch 608, attenuation switches 610, a shunt switch 612, a bypass control line 1008, and an attenuation control line 1010. In the embodiment of FIG. 10, the bypass switch 608, the attenuation switches 610, and the shunt switch 612 each include one or more Field Effect Transistors (FETs). The bypass switch 608 includes two series-connected FETs with channel gates coupled to the bypass control line 1008 through an impedance. The channel gates of the bypass switch 608 FETs receive a signal from the bypass control line 1008 that places the bypass switch 608 FETs in a conducting state or a non-conducting state. When the bypass switch 608 is in a conducting state, e.g., enabled by the bypass control line 1008, the signal path through the attenuation cell 600 is from the attenuation cell input 602 through the bypass switch 608 to the attenuation cell output 604, effectively bypassing the resistive network 606. In this manner, the attenuation cell 600 is in a bypass mode and allows a signal to pass from the attenuation cell input 602 to the attenuation cell output 604 with little to no attenuation.

In embodiments, the bypass switch 608 may include more or fewer switching elements, e.g., more or fewer FETs, BJT's, MEMS switches, diodes, etc.

The attenuation switches 610a, 610b are series-connected with two terminals of the resistive network 606, between the attenuation cell input 602 and the attenuation cell output 604, respectively, and are part of an attenuation path from the attenuation cell input 602 to the attenuation cell output 604. In the embodiment of FIG. 10, the attenuation switches 610a and 610b are each a single FET. The shunt switch 612 is a shunt connection between the third terminal of the resistive network 606 and a reference node, such as ground. In the embodiment of FIG. 10, the shunt switch 612 includes eight (8) FETs connected in series. In this embodiment, the number of FETs in the shunt switch 612 may vary and may be selected to accommodate particular signal voltages along the signal path from the attenuation cell input 602 to the attenuation cell output 604. One design criterion may include a number of FETs to ensure that when the shunt switch 612 is controlled to be in an off (non-conducting) state, enough of the FETs will remain in a non-conducting state to maintain the shunt switch 612 overall in a non-conducting state even as voltages in the FET channels may vary due to a signal traversing from the attenuation cell input 602 to the attenuation cell output 604. Additionally, the number of FETs in the shunt switch 612 may be chosen to provide for varying applications or other operational requirements.

In some embodiments, each FET of the attenuation switches 610 and the shunt switch 612 has a channel gate coupled to an attenuation control line 1010 through impedances. The channel gates of the attenuation switches 610 and the shunt switch 612 FETs receive a signal from the attenuation control line 1010 that places the attenuation switches 610 and the shunt switch 612 in a conducting state or a non-conducting state. When the attenuation switches 610 and the shunt switch 612 are in a conducting state, e.g., enabled by the attenuation control line 1010, and when the bypass switch 608 is in a non-conducting state, e.g., not enabled by the bypass control line 1008, the attenuation cell 600 is in an attenuation mode wherein the signal path through the attenuation cell 600 is from the attenuation cell input 602, through the attenuation switch 610a, through a portion of the resistive network 606, through the attenuation switch 610b, and to the attenuation cell output 604. A portion of the signal energy is also shunted to the reference node through a portion of the resistive network 606, e.g., through shunt impedance $R_1$ and the shunt switch 612. In this manner, the attenuation cell 600 is in an attenuation mode wherein a signal received at the attenuation cell input 602 is attenuated by the resistive network 606 and an attenuated portion of the signal is provided at the attenuation cell output 604.

In various embodiments, any of the bypass switch 608, the attenuation switches 610, and the shunt switch 612, may be constructed of other transistor types, such as Bipolar Junction Transistor (BJT's), or other suitable switching structures, such as MEMS switches or diode arrangements, and each may include more or fewer transistors or switching elements and may be controlled by other arrangements.

In at least one embodiment, the bypass switch 608 and the attenuation switches 610 may be matched to have substantially equivalent effect on a signal whether the attenuation cell 600 is in bypass mode or attenuation mode, yielding a more consistent and predictable variation between the two modes. In at least one embodiment, the bypass switch 608 may be configured to have a parasitic effect substantially equivalent to the total parasitic effects of the attenuation switches 610. The beneficial result is the difference in attenuation between bypass mode and attenuation mode is substantially solely the result of the resistive network 606 because there are minimal, if any, other differences between the bypass path and the attenuation path.

For example, in at least one embodiment, the number and type of switching components, e.g., FETs, included in the bypass path and the attenuation path are equal. For example, as in the attenuation cell of FIG. 10, there are two FETs in the bypass path (e.g., the signal path when the bypass switch 608 is conducting) and two FETs in the attenuation path (e.g., the signal path when the attenuation switches 610 are conducting). Further, the switching components, e.g., FETs, in the bypass switch 608, the attenuation switches 610, and the shunt switch 612, may all be of the same type, variety, and design. Utilizing a matching number and type of switching components results in the switching components having substantially equivalent effect on a signal whether the attenuation cell 600 is in bypass mode or attenuation mode, yielding a more consistent and predictable variation between the two modes. In other words, the difference in attenuation between the two modes is substantially solely due to the resistive network 606, as there are minimal, if any, other differences between the bypass path and the attenuation path.

In some embodiments, the attenuation cell 600 may include a control inverter 1012 that couples the bypass control line 1008 to the attenuation control line 1010 in a manner that holds the bypass control line 1008 signal to be the opposite of the attenuation control line 1010 signal. For example, with the control inverter 1012 optionally included as shown in FIG. 10, a control signal only need be received at the attenuation control line 1010 and the control applied to the bypass switch 608 will automatically be the opposite of the control applied to the attenuation switches 610. In other words, as optionally arranged in FIG. 10, the bypass switch 608 is always off when the attenuation switches 610 and the shunt switch 612 are controlled to be on, and the bypass switch 608 is always on when the attenuation switches 610 and the shunt switch 612 are controlled to be off. In other embodiments, a control inverter 1012 may be included in the reverse orientation, such that the attenuation cell 600 is controlled by a bypass control line 1008 signal, wherein the attenuation switches 610 and the shunt switch 612 automatically receive a control signal that is the opposite of the bypass control line 1008 signal. Providing a control inverter 1012 in either manner provides a benefit of only needing one control input from the exterior of the attenuation cell 600. In other embodiments, as previously described, a control inverter 1012 may not be included so that the bypass control line 1008 and the attenuation control line 1010 may be operated independently.

The above description of the operation and arrangement of the bypass switch 608, the attenuation switches 610, and the shunt switch 612, identifies two modes of the attenuation cell 600, a bypass mode and an attenuation mode. Additionally, the attenuation cell 600 may be controlled to be in an isolated mode by controlling at least the bypass switch 608 and at least one of the attenuation switches 610a, 610b to be non-conducting (i.e., open, or off) at the same time. In the isolated mode effectively none of any signal received at the attenuation cell input 602 is provided at the attenuation cell output 604. While a minimum of the bypass switch 608 and one of the attenuation switches 610 must be off for the attenuation cell 600 to be in an isolated mode, it may be desirable and typical for all switching elements to be off (non-conducting) to produce the maximum isolation between the attenuation cell input 602 and the attenuation cell output 604 when in isolated mode.

The case of the bypass switch 608, the attenuation switches 610, and the shunt switch 612 all being in a conducting state (i.e., closed, or on) is not a typical mode in which to operate the attenuation cell 600, but such a condition is generally substantially equivalent to the bypass mode because a majority of any signal energy received at the attenuation cell input 602 tends to follow a signal path through the conducting bypass switch 608 to the attenuation cell output 604. The attenuation switches 610 being in a conducting state at the same time may cause additional parasitic losses, resulting in a less effective bypass mode than otherwise would be the case.

While the embodiment of FIG. 10 illustrates common control of all transistors of the attenuation switches 610 and the shunt switch 612, and common control of all the transistors of the bypass switch 608, in various embodiments control of the bypass switch 608, the attenuation switches 610, the shunt switch 612, or of individual transistors or switching elements thereof, may be arranged differently. In one such embodiment, one or more of the transistors (or switching elements) of the shunt switch 612 may be controlled separately from the series attenuation switches 610a, 610b. Accordingly, some embodiments support a hybrid attenuation mode wherein the attenuation cell input 602 may be coupled to the attenuation cell output 604, through the resistive network 606, via the attenuation switches 610a and 610b, each in a conducting state, while the shunt switch 612 remains in a non-conducting state. In such a scenario, the attenuation cell 600 may provide a different attenuation level than when the shunt switch 612 is in a conducting state.

The three basic modes of operation, isolated, bypass, and attenuation, are summarized in Table 4 below.

TABLE 4

| Mode | Bypass Switch 608 | Attenuation switches 610a, 610b | Shunt switch 612 |
| --- | --- | --- | --- |
| Bypass Mode | On | Off | Off |
| Isolated Mode | Off | Off | Off |
| Attenuation Mode | Off | On | On |

As illustrated in Table 4, whenever the bypass switch 608 is in a conducting state (on), the attenuation cell 600 is effectively in a bypass mode. The bypass switch 608 in a conducting state forms a substantially direct coupling from the attenuation cell input 602 to the attenuation cell output 604 with substantially no attenuation. Parasitic losses due to the resistive network 606 and the attenuation switches 610 are minimized by having the attenuation switches 610 and the shunt switch 612 in a non-conducting (off) state. In various embodiments, the arrangement may be different, and the bypass mode may be more or less effective based upon the state of the attenuation switches 610 and the shunt switch 612.

As further illustrated in Table 4, when all the switches are off (non-conducting), the attenuation cell 600 is in an isolated mode where substantially none of a signal received at the attenuation cell input 602 is provided at the attenuation cell output 604.

As finally illustrated in Table 4, when the bypass switch 608 is off (non-conducting) and the attenuation switches 610 and the shunt switch 612 are on (conducting), an attenuated portion of a signal received at the attenuation cell input 602 is provided at the attenuation cell output 604. The signal strength at the attenuation cell output 604 is reduced from that at the attenuation cell input 602 by the designed attenuation level of the resistive network 606 as previously described.

In various embodiments, the resistive network 606 used in the attenuation cell 600 may be of varying designs to accommodate changing operational parameters or applications, including attenuation levels and impedance matching. For example, the impedances may be of varying values, as previously discussed, and the resistive network 606 may be of differing circuit design, such as a T, Pi, Delta, bridged, or alternate arrangement. In various embodiments, the resistive network 606 used in the attenuation cell 600 may be a variable, adjustable, or tunable attenuator, or a multi-step attenuator capable of being further controlled to provide various levels of attenuation.

A multi-cell digital switched attenuator, such as shown in FIG. 11, may include numerous attenuation cells 600 connected in series, and a controller 1112 that controls the bypass switch 608, the attenuation switches 610, and the shunt switch 612 of one or more of the attenuation cells 600, to switchably select one or more attenuation cells 600 to be in an attenuation mode, a bypass mode, or an isolated mode. The individual attenuation cells 600 may be designed to provide identical attenuation levels or may be designed to provide different attenuation levels. Higher attenuations are achieved by selecting additional attenuation cells 600 in attenuation mode (in series) to attenuate the signal. Accordingly, a set of attenuation cells 600 may be selected with attenuation levels such that any desired attenuation level is achievable by selectively switching the various series-connected attenuation cells 600 between bypass mode and attenuation mode. In certain embodiments, the attenuation cells 600 may all be of identical design, differing only in the resistive values of their individual resistive networks 606, to provide differing attenuation levels. Additionally, even for differing attenuation levels, all of the attenuation cells 600 may have identical resistor components, varying only in number of the resistor components connected in series and/or parallel, as discussed above. Accordingly, various signal characteristics of each attenuation cell 600 may be substantially similar, varying substantially only by a level of attenuation provided.

FIG. 11 is a block diagram of a digital switched attenuator 1100 including an input 1102, an output 1104, and a plurality of attenuation cells 600 DC coupled in series between the input 1102 and the output 1104. It is appreciated that each attenuation cell 600 has an attenuation cell input 602 and an attenuation cell output 604 that may be serially connected to adjacent attenuation cells 600. The attenuation cell outputs may be coupled to the adjacent attenuation cell inputs without a capacitive coupling element. The attenuation cells 600*a*, 600*n*, at the terminal ends of the digital switched attenuator 1100, provide the input 1102 and the output 1104, respectively, of the overall digital switched attenuator 1100. The digital switched attenuator 1100 may include any number of attenuation cells 600, depending upon operational parameters and varying application needs, and each individual attenuation cell 600 may be of any individual attenuation level. By controlling the operational state of each of the attenuation cells 600, i.e., to be in attenuation mode, bypass mode, or isolated mode, any of various total attenuation levels may be achieved. Various embodiments may have any number of, and any attenuation levels of, attenuation cells 600 arranged in any relative position to one another.

The digital switched attenuator 1100 of FIG. 11 also includes a controller 1112 that controls the bypass control lines 1008 carrying control signals to the attenuation cells 600 and the attenuation control lines 1010 carrying control signals to the attenuation cells 600. The controller 1112 controls the bypass and attenuation signals to the attenuation cells 600, thereby controlling the operational states of the attenuation cells 600 and therefore the total attenuation applied to a signal received at the input 1102. The controller 1112 may receive instructions via a communication interface from another component, such as the digital processor 210 of FIG. 2 or the system controller 552 of FIG. 5, to determine the desired operational state of the digital switched attenuator 1100, or the controller 1112 may have various sensors, such as an output power sensor, and the controller 1112 may be programmed or instructed to maintain a certain output power level, for example. Other components that may communicate with the controller 1112 may include, for example, a baseband transceiver controller, an amplifier controller, a DOCSIS amplifier controller, a coupler controller, a frequency band controller, a controller for a radio frequency front-end module, and the like.

Still referring to FIG. 11, the digital switched attenuator 1100 is capable of passing a signal substantially unattenuated (0 dB attenuation) when the controller 1112 enables a bypass mode in all of the attenuation cells 600 by controlling the bypass switch 608 of each attenuation cell 600 to be in an on (conducting) state. In this state, a signal received at the input 1102 propagates through the bypass switches 608 of all the attenuation cells 600 and is provided at the output 1104 substantially unattenuated.

By controlling signals on the bypass control lines 1008 and the attenuation control lines 1010, and thereby controlling the conducting or non-conducting states of the bypass switches 608 and the attenuation switches 610, respectively, of each attenuation cell 600, the digital switched attenuator 1100 of FIG. 11 may be placed in condition to provide any attenuation level desired from 0 dB (i.e., all attenuation cells 600 in bypass mode) to its maximum attenuation level (i.e., all attenuation cells 600 in attenuation mode), in increments based upon the possible combinations of bypass modes and attenuation modes among all of the attenuation cells 600. Various embodiments may have more or fewer attenuation cells 600, or a different arrangement of attenuation cells 600, or differing incremental attenuation levels, or may have attenuation levels of the attenuation cells 600 chosen, designed, or arranged such that all possible intermediate incremental values are achievable, or may be arranged so only a particular set of attenuation values are achievable without all possible intermediate incremental values being achievable. The controller 1112 may be configured to accept a range of binary input values and map them to a particular total attenuation level by controlling signals on the bypass control lines 1008 and the attenuation control lines 1010.

The digital switched attenuator 1100 of FIG. 11 may substantially reject, or block, a signal received at the input 1102 to provide substantially no signal at the output 1104 (i.e., substantially infinite attenuation), by placing one or more of the attenuation cells 600 into isolated mode. One approach includes placing all the attenuation cells 600 into isolated mode. A better approach may be to place a number of the attenuation cells 600 into attenuation mode, particularly those near the input 1102, and perhaps those near the output 1104, while placing the more central attenuation cells 600 in isolated mode. The benefit of leaving periphery attenuation cells 600 in attenuation mode is that any signal received at the input 1102 (or at the output 1104) is attenuated by the attenuation cells 600 encountered by the signal before reaching an isolated attenuation cell, thus maintaining an impedance match at the input 1102 and the output 1104 and reducing any reflected portion of the received signal. Reflected signal energy will occur at the first isolated attenuation cell 600 the signal encounters, due to the discontinuity of an open circuit in the isolated attenuation cell 600.

For example, if the digital switched attenuator 1100 of FIG. 11 is controlled by the controller 1112 to be in a state where the first two attenuation cells 600a, 600b are in attenuation mode, and the third attenuation cell 600c is in isolated mode, a signal that arrives at the input 1102 is attenuated by the first two attenuation cells 600a, 600b, which may be, for example, an attenuation of 12 dB (e.g., having traveled through two 6 dB attenuation cells) before reaching the isolated third attenuation cell 600c. Any reflected signal, which is signal power being sent back toward the input 1102, is further attenuated by another 12 dB as the reflected signal passes back through the first two attenuation cells 600a, 600b, resulting in the reflected signal being at least 24 dB lower than it might otherwise have been. In this manner, the digital switched attenuator 1100 may be operated to substantially neither pass nor reflect signals received at either of the input 1102 or the output 1104, or both.

In some embodiments, additional control lines may be included to control the input attenuation switch 610a separately from the output attenuation switch 610b of one or more attenuation cells 600, to provide a signal path through a portion of the resistive network 606 of the attenuation cell 600 in isolated mode, further reducing the power of any portion of a reflected signal.

In at least one embodiment, attenuation cells 600 having higher attenuation levels may be provided at the periphery of the digital switched attenuator 1100, e.g., the outermost attenuation cells 600 may have higher attenuation levels than the innermost attenuation cells 600 along the series-connected plurality of attenuation cells. This will result in higher attenuation levels applied to a signal received from either the input 1102 or the output 1104 when the digital switched attenuator 1100 is in an isolated state where periphery attenuation cells are in an attenuation mode and at least one central attenuation cell is in an isolated mode. As discussed above, this reduces the energy of any reflected signal or substantially absorbs all signal energy received.

Conventional multi-cell attenuators require DC-blocking capacitive components to ensure that adjacent switches may have opposing polarity as required by some usage states, and thus DC-blocking capacitors are included in such conventional designs to provide DC isolation. The presence of DC-blocking elements between one or more attenuation cells allows for transistor channels in adjacent attenuation cells to be biased relative to each other, i.e., have a DC voltage offset from the transistor channels of the adjacent attenuation cell. Impedance of such DC-blocking capacitors increases for lower frequency signals, thus blocking such lower frequency signals, or else requiring the capacitors to be made very large. Even so, such DC-blocking capacitors exhibit frequency-dependent effects, limiting an effective frequency range. Accordingly, aspects and embodiments of switched attenuators disclosed herein alleviate or reduce the need for DC-blocking capacitors. Further, fabricating large capacitors is disadvantageous for the typical high cost of circuit space and desired small size and high efficiency of integrated circuits. Accordingly, aspects and embodiments disclosed herein allow multi-cell attenuator designs without capacitive coupling between the attenuation cells and therefore have no channel bias, do not require a negative voltage generator (NVG), have no standby current, and have increased suitability for lower frequency signals, such as into the single digit megahertz frequencies, e.g., 5 MHz, suitable for the DOCSIS 3.1 upstream carrier frequency band of 5 MHz to 204 MHz, for example. Accordingly, aspects and embodiments of digital switched attenuators as disclosed herein are suitable for such applications and may be beneficially incorporated with amplifiers such as the amplifier systems disclosed herein, to provide tunable signal levels within, e.g., a cable modem. For example, the digital switched attenuator 1100 may be advantageously implemented to provide monotonic signal adjustments of 1 dB step sizes or less with accuracy in the +/−0.5 dB or better across the DOCSIS 3.1 upstream frequency band.

Thus, aspects and examples provide various circuit designs to extend the bandwidth of a switched attenuator by, for example, directly DC coupling the attenuation cells in series with one another and without a capacitive component interposed between adjacent attenuation cells. For example, the output of a first attenuation cell may be directly coupled, without a capacitor, to the input of the next attenuation cell. Accordingly, a series of such attenuation cells may be DC coupled such that a DC component at the input may be conveyed from one attenuation cell to the next, and may be conveyed to the output. In some examples, a DC component may be blocked near the output to protect other equipment, or may be blocked after (or outside of) the switched attenuator, or may not be blocked at all.

In addition, example switched attenuators have been provided that incorporate resistor networks within the attenuation cells that are less susceptible to manufacturing variations.

It is to be appreciated that the attenuation cell 600 as shown in either of FIGS. 6 and 10 and the digital switched attenuator 1100 as shown in FIG. 11 may be symmetrical with respect to input and output. The signal path through each attenuation cell 600, and thereby through the digital switched attenuator 1100, is symmetrical with respect to inputs 602, 1102 and outputs 604, 1104. This results in attenuation cells 600 and a digital switched attenuator 1100 capable of acting equally upon a signal whether the signal is received at the input or the output. Accordingly, the labels of input and output may be interchangeable in various embodiments, and the attenuation cell 600 or the digital switched attenuator 1100 may be used in either forward or reverse directions.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A broadband amplifier assembly having a signal input and a signal output, comprising:
    a fixed gain amplifier having an input and an output, the input coupled to the signal input;
    an adjustable attenuator having an input and an output, the input of the adjustable attenuator being coupled to the output of the fixed gain amplifier, the adjustable attenuator having a plurality of attenuation cells directly coupled in series between the input and the output of the adjustable attenuator, the adjustable attenuator having an attenuation mode of operation, a bypass mode of operation, and an isolation mode of operation; and a power amplifier having an input and an output, the input of the power amplifier being coupled to the output of the adjustable attenuator and the output of the power amplifier being coupled to the signal output.

2. The amplifier assembly of claim 1 wherein each respective attenuation cell of the plurality of attenuation cells includes a resistive network coupled between an input of the respective attenuation cell and an output of the respective attenuation cell, the resistive network configured to provide a respective amount of attenuation in the attenuation mode of operation of the respective attenuation cell.

3. A broadband amplifier assembly having a signal input and a signal output, comprising:
a fixed gain amplifier having an input and an output, the input coupled to the signal input;
an adjustable attenuator having an input and an output, the input of the adjustable attenuator being coupled to the output of the fixed gain amplifier, the adjustable attenuator having a plurality of attenuation cells directly coupled in series between the input and the output of the adjustable attenuator, each respective attenuation cell of the plurality of attenuation cells including a resistive network coupled between an input of the respective attenuation cell and an output of the respective attenuation cell, the resistive network configured to provide a respective amount of attenuation in an attenuation mode of operation of the respective attenuation cell, each respective attenuation cell further including a shunt switch coupled between the resistive network and a reference node to selectively connect the resistive network to the reference node; and
a power amplifier having an input and an output, the input of the power amplifier being coupled to the output of the adjustable attenuator and the output of the power amplifier being coupled to the signal output.

4. The amplifier assembly of claim 3 wherein each respective attenuation cell further includes a bypass switch in parallel with the resistive network, the bypass switch configured to selectively couple the input of the respective attenuation cell to the output of the respective attenuation cell in a bypass mode of operation of the respective attenuation cell.

5. The amplifier assembly of claim 4 wherein each respective attenuation cell further includes an isolation switch coupled in series with the resistive network, the isolation switch and the resistive network being in parallel with the bypass switch, the isolation switch configured to selectively isolate the resistive network from one of the input of the respective attenuation cell or the output of the respective attenuation cell in the bypass mode of operation of the respective attenuation cell.

6. The amplifier assembly of claim 5 wherein the bypass switch and the isolation switch each include a switching element of substantially similar parasitic characteristics.

7. The amplifier assembly of claim 5 wherein the isolation switch is configured to selectively isolate the resistive network from one of the input of the respective attenuation cell or the output of the respective attenuation cell in an isolation mode of operation of the respective attenuation cell.

8. The amplifier assembly of claim 2 wherein each respective attenuation cell includes a shunt switch coupled between the resistive network and a reference node to selectively connect the resistive network to the reference node.

9. The amplifier assembly of claim 8 wherein the shunt switch includes a plurality of switching elements.

10. The amplifier assembly of claim 2 wherein each respective attenuation cell further includes a bypass switch in parallel with the resistive network, the bypass switch configured to selectively couple the input of the respective attenuation cell to the output of the respective attenuation cell in the bypass mode of operation of the respective attenuation cell.

11. A broadband amplifier assembly having a signal input and a signal output, comprising:
a fixed gain amplifier having an input and an output, the input coupled to the signal input;
an adjustable attenuator having an input and an output, the input of the adjustable attenuator being coupled to the output of the fixed gain amplifier, the adjustable attenuator having a plurality of attenuation cells directly coupled in series between the input and the output of the adjustable attenuator, the adjustable attenuator having an attenuation mode of operation, a bypass mode of operation, and an isolation mode of operation;
a variable gain amplifier having an input and an output, the input of the variable gain amplifier being coupled to the output of the adjustable attenuator and the output of the variable gain amplifier being coupled to the signal output; and
a controller configured to control an amount of attenuation provided by the adjustable attenuator in the attenuation mode of operation and an amount of gain provided by the variable gain amplifier to provide a range of overall gain combinations.

12. The amplifier assembly of claim 11 wherein each respective attenuation cell of the plurality of attenuation cells includes a resistive network coupled between an input of the respective attenuation cell and an output of the respective attenuation cell, the resistive network configured to provide a respective amount of attenuation in the attenuation mode of operation of the respective attenuation cell.

13. The amplifier assembly of claim 12 wherein each respective attenuation cell includes a shunt switch coupled between the resistive network and a reference node to selectively connect the resistive network to the reference node.

14. The amplifier assembly of claim 13 wherein each respective attenuation cell further includes a bypass switch in parallel with the resistive network, the bypass switch configured to selectively couple the input of the respective attenuation cell to the output of the respective attenuation cell in the bypass mode of operation of the respective attenuation cell.

15. The amplifier assembly of claim 14 wherein each respective attenuation cell further includes an isolation switch coupled in series with the resistive network, the isolation switch and the resistive network being in parallel with the bypass switch, the isolation switch configured to selectively isolate the resistive network from one of the input of the respective attenuation cell or the output of the respective attenuation cell in the bypass mode of operation of the respective attenuation cell.

16. The amplifier assembly of claim 15 wherein the bypass switch and the isolation switch each include a switching element of substantially similar parasitic characteristics.

17. The amplifier assembly of claim 15 wherein the isolation switch is configured to selectively isolate the resistive network from one of the input of the respective attenuation cell or the output of the respective attenuation cell in the isolation mode of operation of the respective attenuation cell.

18. A communication device, comprising:
- a transceiver configured to produce a transmit signal and to receive a receive signal;
- a fixed gain amplifier having an input and an output, the input coupled to the transceiver to receive the transmit signal;
- an adjustable attenuator having an input and an output, the input of the adjustable attenuator being coupled to the output of the fixed gain amplifier, the adjustable attenuator having a plurality of attenuation cells directly coupled in series between the input and the output of the adjustable attenuator, the adjustable attenuator having an attenuation mode of operation, a bypass mode of operation, and an isolation mode of operation; and
- a power amplifier having an input and an output, the input of the power amplifier being coupled to the output of the adjustable attenuator and the output of the power amplifier being coupled to an output terminal.

19. The communication device of claim 18 wherein the power amplifier is a variable gain amplifier.

20. The communication device of claim 18 further comprising a receive amplifier coupled to the transceiver to provide the receive signal.

* * * * *